(12) United States Patent
Nomura et al.

(10) Patent No.: US 11,370,694 B2
(45) Date of Patent: *Jun. 28, 2022

(54) ALKALI-FREE GLASS SUBSTRATE, LAMINATED SUBSTRATE, AND METHOD FOR MANUFACTURING GLASS SUBSTRATE

(71) Applicant: AGC INC., Chiyoda-ku (JP)

(72) Inventors: Shuhei Nomura, Tokyo (JP); Kazutaka Ono, Tokyo (JP)

(73) Assignee: AGC INC., Chiyoda-ku (JP)

( * ) Notice: Subject to any disclaimer, the term of this patent is extended or adjusted under 35 U.S.C. 154(b) by 59 days.

This patent is subject to a terminal disclaimer.

(21) Appl. No.: 16/195,001

(22) Filed: Nov. 19, 2018

(65) Prior Publication Data

US 2019/0084868 A1 Mar. 21, 2019

Related U.S. Application Data

(63) Continuation of application No. PCT/JP2017/019069, filed on May 22, 2017.

(30) Foreign Application Priority Data

May 25, 2016 (JP) .............................. JP2016-104652
Aug. 5, 2016 (JP) .............................. JP2016-154685

(51) Int. Cl.
*B32B 15/04* (2006.01)
*B32B 17/06* (2006.01)
(Continued)

(52) U.S. Cl.
CPC .............. *C03C 3/091* (2013.01); *B32B 9/005* (2013.01); *B32B 17/06* (2013.01); *C03C 3/093* (2013.01);
(Continued)

(58) Field of Classification Search
CPC ................ B32B 17/06; B32B 2457/20; B32B 2260/023; B32B 2315/08;
(Continued)

(56) References Cited

U.S. PATENT DOCUMENTS 5,801,109 A * 9/1998 Nishizawa .............. C03C 3/091
501/66
5,885,914 A * 3/1999 Nishizawa .............. C03C 3/091
501/66
(Continued)

FOREIGN PATENT DOCUMENTS

CN 102448901 5/2012
JP 9-100135 4/1997
(Continued)

OTHER PUBLICATIONS

JP2007008812 English machine translation.*
(Continued)

*Primary Examiner* — Lauren R Colgan
(74) *Attorney, Agent, or Firm* — Oblon, McClelland, Maier & Neustadt, L.L.P.

(57) ABSTRACT

An alkali-free glass substrate includes, as represented by molar percentage based on oxides, 11.0% or more of $Al_2O_3$, 8.0% or more of $B_2O_3$, and 1% or more of SrO. The alkali-free glass substrate has an average coefficient of thermal expansion $\alpha_{100/200}$ at 100 to 200° C. of from 3.10 ppm/° C. to 3.70 ppm/° C., a Young's modulus of 76.0 GPa or less, and a density of 2.42 g/cm³ or more.

25 Claims, 4 Drawing Sheets

(51) Int. Cl.
*C03C 3/091* (2006.01)
*C03C 3/093* (2006.01)
*H01L 23/15* (2006.01)
*B32B 9/00* (2006.01)
*H01L 27/146* (2006.01)
*H01L 23/373* (2006.01)

(52) U.S. Cl.
CPC ........ *H01L 23/15* (2013.01); *H01L 27/14618* (2013.01); *B32B 2457/00* (2013.01); *H01L 23/3731* (2013.01)

(58) Field of Classification Search
CPC . B32B 17/10018; B32B 5/32; C03C 2204/00; C03C 3/062; C03C 3/064; C03C 1/00; C03C 3/00; C03C 4/00
USPC .................................. 428/426, 428, 432, 688
See application file for complete search history.

(56) References Cited

U.S. PATENT DOCUMENTS

| | | | | |
|---|---|---|---|---|
| 6,169,047 | B1* | 1/2001 | Nishizawa | C03C 3/091 |
| | | | | 428/428 |
| 6,537,937 | B1* | 3/2003 | Nishizawa | C03C 3/091 |
| | | | | 501/66 |
| 6,867,158 | B2* | 3/2005 | Peuchert | C03C 3/091 |
| | | | | 501/67 |
| 7,968,482 | B2* | 6/2011 | Komori | C03C 3/091 |
| | | | | 501/65 |
| RE46,337 | E | 3/2017 | Ellison | |
| 9,643,883 | B2* | 5/2017 | Aitken | C03C 17/3429 |
| 2002/0022566 | A1* | 2/2002 | Park | C03C 3/093 |
| | | | | 501/70 |
| 2002/0151426 | A1* | 10/2002 | Murata | C03C 3/093 |
| | | | | 501/66 |
| 2002/0183188 | A1* | 12/2002 | Peuchert | C03C 3/091 |
| | | | | 501/66 |
| 2006/0003884 | A1* | 1/2006 | Nishizawa | C03C 3/091 |
| | | | | 501/72 |
| 2007/0027019 | A1* | 2/2007 | Nishizawa | C03C 3/091 |
| | | | | 501/65 |
| 2007/0213194 | A1 | 9/2007 | Abensour et al. | |
| 2009/0170684 | A1 | 7/2009 | Kato et al. | |
| 2009/0226671 | A1* | 9/2009 | Yanase | C03B 17/064 |
| | | | | 428/156 |
| 2009/0270242 | A1* | 10/2009 | Yanase | C03C 3/091 |
| | | | | 501/67 |
| 2009/0275462 | A1 | 11/2009 | Murata | |
| 2009/0294773 | A1* | 12/2009 | Ellison | C03C 3/091 |
| | | | | 257/72 |
| 2011/0318561 | A1 | 12/2011 | Murata et al. | |
| 2012/0178613 | A1 | 7/2012 | Kato et al. | |
| 2013/0065748 | A1* | 3/2013 | Koyama | C03B 17/064 |
| | | | | 501/67 |
| 2015/0087495 | A1* | 3/2015 | Nishizawa | C03C 3/093 |
| | | | | 501/67 |
| 2016/0039710 | A1* | 2/2016 | Tokunaga | C03C 3/087 |
| | | | | 501/59 |

FOREIGN PATENT DOCUMENTS

| | | | |
|---|---|---|---|
| JP | 9-169538 | | 6/1997 |
| JP | 9-169539 | | 6/1997 |
| JP | 10-72237 | | 3/1998 |
| JP | 11-292563 | | 10/1999 |
| JP | 3153710 | | 4/2001 |
| JP | 2001-220173 | | 8/2001 |
| JP | 2002-37642 | | 2/2002 |
| JP | 2005-126311 | | 5/2005 |
| JP | 2006-347796 | | 12/2006 |
| JP | 2007008812 | * | 1/2007 |
| JP | 2008-222542 | | 9/2008 |
| JP | 2009-541185 | | 11/2009 |
| JP | 2009-286689 | | 12/2009 |
| WO | WO 2007/069739 A1 | | 6/2007 |

OTHER PUBLICATIONS

International Search Report dated Aug. 22, 2017 in PCT/JP2017/019069, filed on May 22, 2017 (with English Translation).
Written Opinion dated Aug. 22, 2017 in PCT/JP2017/019069, filed on May 22, 2017.
Kitagorodsky, et al., "The last volume of Glass Technology", translated by Compilation Section, Heavy Industry Building Materials Industry Administration, p. 8, Architectural Engineering Publishing House, Jun. 1965.

* cited by examiner

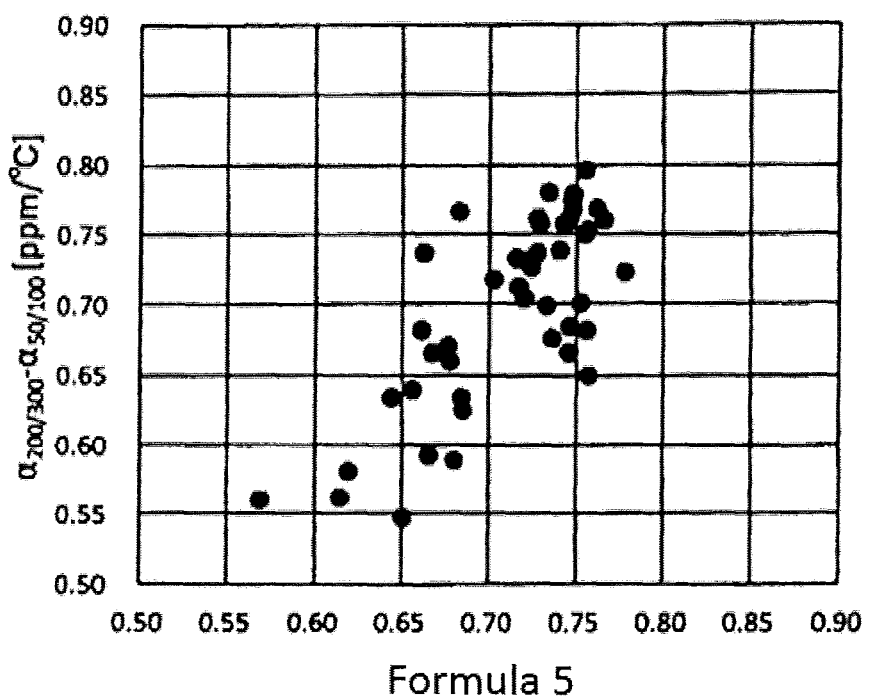

ALKALI-FREE GLASS SUBSTRATE, LAMINATED SUBSTRATE, AND METHOD FOR MANUFACTURING GLASS SUBSTRATE

TECHNICAL FIELD

The present invention relates to an alkali-free glass substrate, a laminated substrate, and a method for manufacturing a glass substrate.

BACKGROUND ART

As for an image sensor such as chip size package (CSP), a system of protecting a silicon substrate by laminating a glass substrate thereon is known. For example, Patent Document 1 discloses a glass for silicon pedestal, in which the elongation percentage by thermal expansion is approximated to the elongation percentage by thermal expansion of the silicon substrate to be bonded with the glass.

PRIOR ART LITERATURE

Patent Document

Patent Document 1: Japanese Patent No. 3,153,710

SUMMARY OF THE INVENTION

Problems that the Invention is to Solve

In the semiconductor fabrication process, each of a silicon substrate and a glass substrate is cut in the wafer state, and the silicon substrate and the glass substrate are then laminated together and subjected to a series of fabrication steps, such as die bonding, wire bonding and molding. In recent years, fabrication by a wafer-level packaging technique has been proposed, in which a silicon substrate and a glass substrate are laminated together in the wafer state, subjected to fabrication steps, and then cut.

In order to laminate together a silicon substrate and a glass substrate, a glass substrate having high flatness and small total thickness variation (TTV) is demanded. However, it is difficult for existing glass forming techniques to obtain desired total thickness variation or flatness, and the total thickness variation or flatness needs to be improved by grinding the formed glass substrate.

After outline machining of a raw sheet produced by a float process, etc. into a wafer state, the glass substrate used for an image sensor is processed through, for example, a grinding (lapping) step of removing distortion in the wafer surface layer part and thereby adjusting the external dimension of the wafer to fall within the standards, and a polishing step of removing microcracks in the wafer surface layer part or reducing the surface roughness. In order to obtain a glass substrate having low sheet thickness deviation and high flatness with good productivity, a high grinding rate in the lapping step is demanded.

A heat treatment step is required for laminating together the silicon substrate and the glass substrate. In the heat treatment step, the temperature of a laminated substrate obtained by laminating together the silicon substrate and the glass substrate at a temperature of, for example, 200 to 400° C. is lowered to room temperature. At this time, if there is a difference in the coefficient of thermal expansion between the silicon substrate and the glass substrate, a large residual strain (residual deformation) is caused to occur in the silicon substrate due to a difference in the amount of thermal expansion.

Furthermore, in the wafer-level packaging technique, the silicone substrate and the glass substrate are laminated together in the wafer state and therefore, even if the difference in the thermal expansion difference is at a level heretofore not posed a problem, a residual strain is readily generated in the silicon substrate.

Patent Document 1 has proposed glass for silicon pedestal, characterized in that the ratio $\alpha_1/\alpha_2$ of the elongation percentage al by thermal expansion of the glass and the elongation percentage $\alpha_2$ by thermal expansion of the silicon base material to be bonded with the glass is from 0.8 to 1.2. However, as regards the glass of Examples disclosed in Patent Document 1, its match in coefficient of thermal expansion with that of the silicon substrate is insufficient, and the wafer-level packaging technique is likely to accompany generation of a residual strain in the silicone substrate.

Accordingly, the present invention provides a glass substrate and a method for manufacturing a glass substrate, in which the grinding rate is high and in the heat treatment step of laminating together a silicon substrate and a glass substrate, the residual stain generated in the silicon substrate is small. The present invention also provides a laminated substrate using the glass substrate. The present invention also provides a glass substrate having a high grinding rate and excellent processability, which is a glass substrate used for at least either one of a support substrate for semiconductor production process and a cover glass, a laminated substrate, and a method for manufacturing a glass substrate.

Means for Solving the Problems

The present inventors have found that when the composition and the properties such as coefficient of thermal expansion, Young's modulus and density of glass are set to specific ranges, a glass substrate in which the grinding rate is high and the coefficient of thermal expansion matches that of the silicon substrate is obtained. The present invention has been accomplished based on this finding.

An alkali-free glass substrate of the present invention includes, as represented by molar percentage based on oxides, 11.0% or more of $Al_2O_3$, 8.0% or more of $B_2O_3$, and 1% or more of SrO, and has an average coefficient of thermal expansion $\alpha_{100/200}$ at 100 to 200° C. of from 3.10 ppm/° C. to 3.70 ppm/° C., a Young's modulus of 76.0 GPa or less, and a density of 2.42 g/cm$^3$ or more.

An alkali-free glass substrate of the present invention has a degree of wear of 55 or more and being used for at least either one of a support substrate for semiconductor production process and a cover glass.

A laminated substrate of the present invention includes the alkali-free glass substrate and a silicon substrate stacked thereon.

A method for manufacturing an alkali-free glass substrate of the present invention includes, a melting step of heating a glass raw material to obtain a molten glass, a refining step of removing bubbles from the molten glass, a forming step of forming the molten glass into a sheet-like shape to obtain a glass ribbon, and a slow cooling step of gradually cooling the glass ribbon to a room temperature state, wherein a composition of the obtained glass substrate comprises, as represented by molar percentage based on oxides, 11.0% or more of $Al_2O_3$, 8.0% or more of $B_2O_3$, and 1% or more of SrO, and the composition of the obtained glass substrate and an average cooling rate R (unit: ° C./min) from a temperature at which a viscosity of the glass ribbon in the slow cooling step becomes $10^{13}$ d·Pa·s to a temperature at which a viscosity becomes $10^{14.5}$ d·Pa·s satisfy the following conditions (1) to (3):

0.0181×(content of $SiO_2$)+0.0004×(content of $Al_2O_3$)+0.0387×(content of $B_2O_3$)+0.0913× (content of MgO)+0.1621×(content of CaO)+ 0.1900×(content of SrO)+0.2180×(content of BaO)+0.0424×(content of ZnO)+0.0391×$\log_{10}$R is from 3.10 to 3.70,  condition (1):

0.0218×(content of $SiO_2$)+0.0302×(content of $Al_2O_3$)+0.0181×(content of $B_2O_3$)+0.0330× (content of MgO)+0.0351×(content of CaO)+ 0.0488×(content of SrO)+0.0634×(content of BaO)+0.0419×(content of ZnO) is 2.42 or more, and  condition (2):

0.677×(content of $SiO_2$)+1.598×(content of $Al_2O_3$)− 0.220×(content of $B_2O_3$)+1.466×(content of MgO)+1.135×(content of CaO)+0.667×(content of SrO)+0.298×(content of BaO)+1.027×(content of ZnO) is 76.0 or less,  condition (3):

wherein the contents of $SiO_2$, $Al_2O_3$, $B_2O_3$, MgO, CaO, SrO, BaO and ZnO are contents as represented by molar percentage based on oxides contained in a obtained glass.

Advantage of the Invention

The present invention can provide a glass substrate, a laminated substrate, a method for manufacturing a glass substrate, in which the grinding rate is high and the coefficient of thermal expansion matches that of the silicon substrate. In addition, the present invention can provide a glass substrate having a high grinding rate and excellent processability, which is a glass substrate used for at least either one of a support substrate for semiconductor production process and a cover glass, a laminated substrate, and a method for manufacturing a glass substrate.

BRIEF DESCRIPTION OF THE DRAWINGS

FIG. 1A is a cross-sectional view before lamination together; and FIG. 1B is a cross-sectional view after lamination together.

FIG. 6 is a diagram graphically illustrating the error between the value determined according to formula (5) and the value of $\alpha_{200/300}-\alpha_{50/100}$.

MODE FOR CARRYING OUT THE INVENTION

One embodiment of the present invention is described below.

In the present description, unless otherwise indicated, the content of each component in the glass substrate and a manufacturing method thereof is as represented by molar percentage based on oxides.

Figure 1A:
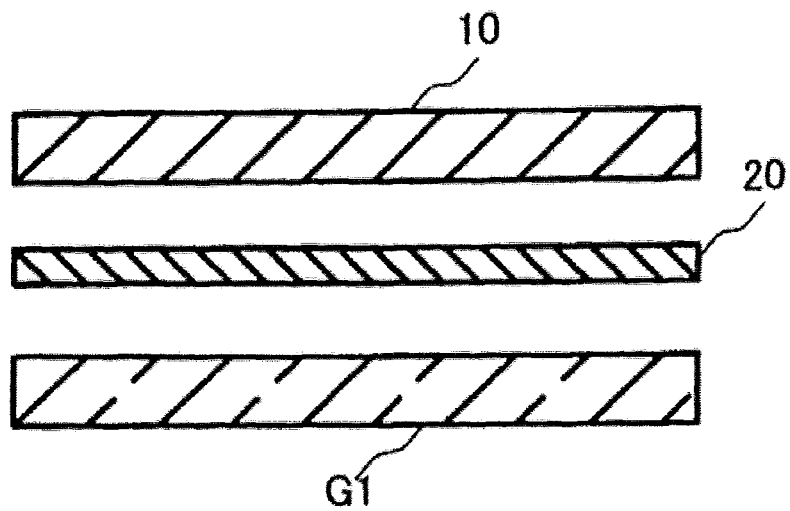
FIG. 1A and FIG. 1B illustrate a glass substrate according to one embodiment of the present invention, which is laminated together with a silicon substrate.
Figure 1B:
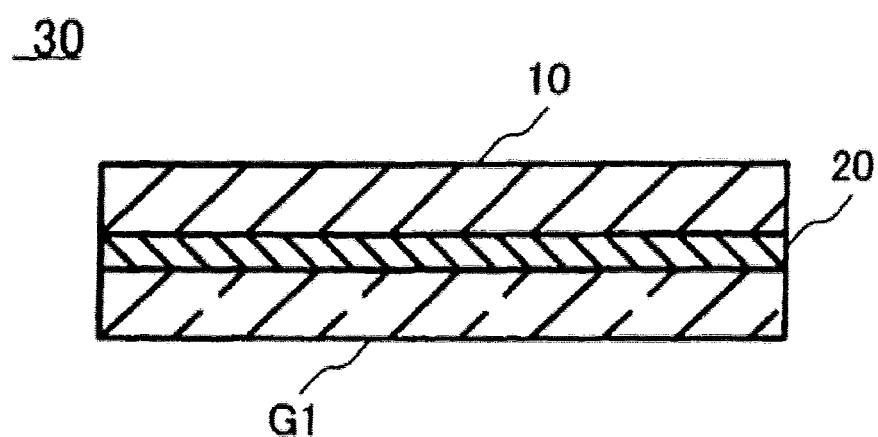

Furthermore, in the present description, unless otherwise indicated, the "–" indicating a numerical value range is used in the sense of including the numerical values before and after that as a lower limit value and an upper limit value FIG. 1A and FIG. 1B illustrate a glass substrate according to one embodiment of the present invention, which is laminated together with a silicon substrate. The glass substrate G1 obtained by the present invention illustrated in FIG. 1A and a silicon substrate 10 sandwich a resin 20 and are laminated together, for example, at a temperature of 200 to 400° C. to obtain a laminated substrate 30 illustrated in FIG. 1B. As the silicon substrate 10, for example, a wafer (for example, a wafer containing silicon as a component, such as silicon wafer) is used. The resin 20 may be any resin as long as it can withstand the temperature of 200 to 400° C.

The glass substrate of the present invention is an alkali-free glass substrate. In the alkali-free glass substrate, the content of an alkali metal oxide is preferably from 0% to 0.1%. The content of an alkali metal oxide is more preferably 0.05% or less, still more preferably 0.02% or less, and it is particularly preferable to contain substantially no alkali metal oxide. When the content of an alkali metal oxide is 0.1% or less, an alkali ion can hardly diffuse into the silicon substrate in the heat treatment step of laminating together the silicon substrate and the glass substrate.

Here, "contain substantially no alkali metal oxide" means that an alkali metal oxide is not contained at all or an alkali metal oxide may be contained as an impurity mixed unavoidably due to manufacturing reason. The alkali metal oxide includes, for example, $Li_2O$, $Na_2O$, and $K_2O$.

The glass substrate of the present invention contains, as represented by molar percentage based on oxides, 11.0% or more of $Al_2O_3$, 8.0% or more of $B_2O_3$, and 1% or more of SrO. In addition, the glass substrate of the present invention preferably has the following composition:

$SiO_2$: from 50% to 75%,
$Al_2O_3$: from 11.0% to 16%,
$B_2O_3$: from 8.0% to 16%,
MgO: from 0% to 10%,
CaO: from 0% to 10%,
SrO: from 1% to 10%,
BaO: from 0% to 10%, and
ZnO: from 0% to 10%.

$SiO_2$ is a component forming network of glass. The content of $SiO_2$ is preferably 50% or more, more preferably 55% or more, still more preferably 58% or more, yet still more preferably 60% or more. When the content of $SiO_2$ is 50% or more, the heat resistance, chemical durability and weather resistance are improved. In addition, the content of $SiO_2$ is preferably 75% or less, more preferably 72% or less, still more preferably 70% or less, yet still more preferably 66% or less. When the content of $SiO_2$ is 75% or less, the viscosity during glass melting does not rise excessively, offering good meltability, and the density increases.

The content of $Al_2O_3$ is 11.0% or more, preferably 11.5% or more, more preferably 12% or more. When the content of $Al_2O_3$ is 11.0% or more, the difference in coefficient of thermal expansion from the silicon substrate is reduced, and the weather resistance, heat resistance and chemical durability are improved. In addition, the content of $Al_2O_3$ is preferably 16% or less, more preferably 15% or less, still more preferably 14% or less, yet still more preferably 13% or less. When the content of $Al_2O_3$ is 16% or less, the viscosity during glass melting does not rise excessively, offering good meltability, devitrification is less likely to occur, and the Young's modulus can be reduced.

The content of $B_2O_3$ is preferably 7.5% or more, more preferably 8.0% or more, still more preferably 9% or more. When the content of $B_2O_3$ is 7.5% or more, preferably 8.0% or more, the viscosity during glass melting does not rise excessively, offering good meltability, devitrification is less likely to occur, and the grindability can be ensured. In addition, the content of $B_2O_3$ is preferably 16% or less, more preferably 14% or less, still more preferably 13% or less, yet still more preferably 12% or less. When the content of $B_2O_3$ is 16% or less, the glass transition temperature can be raised, and the density can be increased.

MgO is not an essential component, but when contained, the difference in the coefficient of thermal expansion from the silicon substrate is reduced, the viscosity during glass melting does not rise excessively, offering good meltability, and the weather resistance is enhanced. In the case of containing MgO, the content of MgO is preferably 1% or more, more preferably 2% or more. In addition, the content of MgO is preferably 10% or less, more preferably 9% or less, still more preferably 8% or less, yet still more preferably 7% or less. When the content of MgO is 10% or less, devitrification is less likely to occur, and the Young's modulus can be reduced.

CaO is not an essential component, but when contained, the viscosity during glass melting does not rise excessively, offering good meltability, and the weather resistance is enhanced. In the case of containing CaO, the content of CaO is preferably 0.5% or more, more preferably 1% or more. In addition, the content of CaO is preferably 10% or less, more preferably 9% or less, still more preferably 8% or less, yet still more preferably 7% or less. When the content of CaO is 10% or less, devitrification is less likely to occur, and the Young's modulus can be reduced.

The content of SrO is 1% or more, preferably 1.5% or more, more preferably 3% or more, still more preferably 4% or more. When the content of SrO is 1% or more, the viscosity during glass melting does not rise excessively, offering good meltability, the weather resistance is enhanced, and the density can be increased. In addition, the content of SrO is preferably 10% or less, more preferably 9% or less, still more preferably 8% or less. When the content of SrO is 10% or less, devitrification is less likely to occur.

BaO is not an essential component, but when contained, the viscosity during glass melting does not rise excessively, offering good meltability, the weather resistance is enhanced, and the density can be increased. In the case of containing BaO, the content of BaO is preferably 0.5% or more, more preferably 1% or more. The content of BaO is preferably 10% or less, more preferably 9% or less, still more preferably 8% or less, yet still more preferably 7% or less. When the content of BaO is 10% or less, devitrification is less likely to occur.

ZnO is not an essential component, but when contained, the coefficient of thermal expansion can be adjusted while enhancing the meltability. In the case of containing ZnO, the content of ZnO is preferably 0.5% or more, more preferably 1% or more. The content of ZnO is preferably 10% or less, more preferably 9% or less, still more preferably 8% or less, yet still more preferably 7% or less. When the content of ZnO is 10% or less, the devitrification temperature of glass can be lowered.

In the glass substrate of the present invention, the total content of MgO and CaO is preferably 1% or more, more preferably 2% or more, still more preferably 3% or more. When the total content of MgO and CaO is 1% or more, the coefficient of thermal expansion can be easily matched between the glass substrate and the silicon substrate. In addition, the total content of MgO and CaO is preferably 15% or less, more preferably 13% or less, still more preferably 10% or less. When the total content of MgO and CaO is 15% or less, it becomes possible to reduce the Young's modulus and increase the density.

In the glass substrate of the present invention, the total content of MgO, CaO, SrO, BaO and ZnO is preferably 7% or more, more preferably 9% or more, still more preferably 10% or more. When the total content of MgO, CaO, SrO, BaO and ZnO is 7% or more, the coefficient of thermal expansion can be easily matched between the glass substrate and the silicon substrate, and the density can be increased.

In the case of using the glass substrate of the present invention as a cover glass of an image sensor, it is preferable to absorb little visible light. For this purpose, the content of $Fe_2O_3$ is, as represented by mass ppm based on oxides, preferably 200 ppm or less, more preferably 150 ppm or less, still more preferably 100 ppm or less, yet still more preferably 50 ppm or less.

In order to increase the thermal conductivity and improve the meltability, the glass substrate of the present invention preferably contains, as represented by mass ppm based on oxides, from more than 200 ppm and 1,000 ppm or less of $Fe_2O_3$. When the content of $Fe_2O_3$ is more than 200 ppm, it becomes possible to increase the thermal conductivity of the glass substrate and improve the meltability. When the content of $Fe_2O_3$ is 1,000 ppm or less, absorption of visible light is not enhanced excessively. The content of $Fe_2O_3$ is more preferably 300 ppm or more, still more preferably 400 ppm or more, yet still more preferably 500 ppm or more. The content of $Fe_2O_3$ is more preferably 800 ppm or less, still more preferably 700 ppm or less, yet still more preferably 600 ppm or less.

In the glass substrate of the present invention, for example, $SnO_2$, $SO_3$, Cl, or F may be contained as a refining agent.

In the glass substrate of the present invention, for example, $Li_2O$, $WO_3$, $Nb_2O_5$, $V_2O_5$, $Bi_2O_3$, $MoO_3$, $P_2O_5$, $Ga_2O_3$, $I_2O_5$, $In_2O_5$, or $Ge_2O_5$ may be contained so as to improve the weather resistance, meltability, devitrification property, ultraviolet shielding, infrared shielding, ultraviolet transmission, infrared transmission, etc.

In the glass substrate of the present invention, the glass may contain $ZrO_2$, $Y_2O_3$, $La_2O_3$, $TiO_2$ and $SnO_2$ in a combined amount of 2% or less, preferably 1% or less, more preferably 0.5% or less, so as to enhance the chemical durability of glass.

In the glass substrate of the present invention, considering an environmental load, it is preferred that $As_2O_3$ and $Sb_2O_3$ are not substantially contained.

In the glass substrate of the present invention, an average coefficient of thermal expansion $\alpha_{100/200}$ at 100 to 200° C. is 3.10 ppm/° C. or more, preferably 3.20 ppm/° C. or more, more preferably 3.25 ppm/° C. or more, still more preferably 3.30 ppm/° C. or more. In addition, $\alpha_{100/200}$ is 3.70 ppm/° C. or less, preferably 3.60 ppm/° C. or less, more preferably 3.55 ppm/° C. or less, still more preferably 3.50 ppm/° C. or less. When $\alpha_{100/200}$ is in the range above, the difference in coefficient of thermal expansion from the silicon substrate can be reduced.

Here, the average coefficient of thermal expansion $\alpha_{100/200}$ at 100 to 200° C. is an average coefficient of thermal expansion as measured by the method prescribed in JIS R3102 (1995), in which the temperature range when measuring the coefficient of thermal expansion is from 100 to 200° C.

In the glass substrate of the present invention, the Young's modulus is 76.0 GPa or less, preferably 75.5 GPa or less, more preferably 75.0 GPa or less, still more preferably 74.0 GPa or less. The lower limit is not particularly limited but is typically 60 GPa or more and may be 65 GPa or more, or 70 GPa or more. When the Young's modulus is 76.0 GPa or less, the toughness of the glass substrate is reduced, and the grinding rate and polishing rate can thereby be raised. In addition, damage due to contact with a silicon substrate, a peripheral member, etc. can be prevented. When the Young's modulus is 60 GPa or more, self-weight deflection can be reduced at the time of transportation of the glass substrate.

In the glass substrate of the present invention, the density is 2.42 g/cm$^3$ or more, preferably 2.43 g/cm$^3$ or more, more preferably 2.44 g/cm$^3$ or more, still more preferably 2.45 g/cm$^3$ or more. In addition, the density is preferably 2.55 g/cm$^3$ or less, more preferably 2.54 g/cm$^3$ or less, still more preferably 2.53 g/cm$^3$ or less. When the density is in the range above, it becomes possible to increase the brittleness of the glass substrate and raise the grinding rate and polishing rate.

In the glass substrate of the present invention, the value $\alpha_{200/300}/\alpha_{50/100}$ obtained by dividing the average coefficient of thermal expansion $\alpha_{200/300}$ at 200 to 300° C. by the average coefficient of thermal expansion $\alpha_{50/100}$ at 50 to 100° C. is preferably 1.15 or more, more preferably 1.16 or more, still more preferably 1.17 or more, yet still more preferably 1.18 or more.

In addition, $\alpha_{200/300}/\alpha_{50/100}$ is preferably 1.35 or less, more preferably 1.30 or less, still more preferably 1.28 or less, yet still more preferably less than 1.20. The value $\alpha_{200/300}/\alpha_{50/100}$ may be 1.15 or more and less than 1.20, may be 1.16 or more and less than 1.20, or may be 1.18 or more and less than 1.20.

When $\alpha_{200/300}/\alpha_{50/100}$ is in the range above, the difference in the coefficient of thermal expansion from the silicon substrate can be reduced. Above all, in a wide temperature region from room temperature to 300° C., the difference in the coefficient of thermal expansion from the silicon substrate can be reduced. Here, the average coefficient of thermal expansion $\alpha_{200/300}$ at 200 to 300° C. is an average coefficient of thermal expansion as measured by the method prescribed in JIS R3102 (1995), in which the temperature range when measuring the coefficient of thermal expansion is from 200 to 300° C.

In the glass substrate of the present invention, the value $\alpha_{200/300}/\alpha_{50/100}$ obtained by subtracting the average coefficient of thermal expansion $\alpha_{50/100}$ at 50 to 100° C. from the average coefficient of thermal expansion $\alpha_{200/300}$ at 200 to 300° C. is preferably 0.30 or more, more preferably 0.35 or more, still more preferably 0.40 or more. In addition, $\alpha_{200/300}/\alpha_{50/100}$ is preferably 1.20 or less, more preferably 1.00 or less, still more preferably 0.90 or less. When $\alpha_{200/300}/\alpha_{50/100}$ is in the range above, the difference in the coefficient of thermal expansion from the silicon substrate can be reduced. Above all, in a wide temperature region from room temperature to 300° C., the difference in the coefficient of thermal expansion from the silicon substrate can be reduced.

In the glass substrate of the present invention, the average coefficient of thermal expansion $\alpha_{200/300}$ at 200 to 300° C. is preferably from 3.45 ppm/° C. to 3.95 ppm/° C. The value $\alpha_{200/300}$ is more preferably 3.50 ppm/° C. or more, still more preferably 3.55 ppm/° C. or more, yet still more preferably 3.60 ppm/° C. or more, and most preferably 3.62 ppm/° C. or more. In addition, $\alpha_{200/300}$ is more preferably 3.85 ppm/° C. or less, still more preferably 3.75 ppm/° C. or less, yet still more preferably 3.73 ppm/° C. or less, and most preferably 3.71 ppm/° C. or less.

In the glass substrate of the present invention, the average coefficient of thermal expansion $\alpha_{50/100}$ at 50 to 100° C. is preferably from 2.70 ppm/° C. to 3.20 ppm/° C. The value $\alpha_{50/100}$ is more preferably 2.80 ppm/° C. or more, still more preferably 2.90 ppm/° C. or more, yet still more preferably 2.91 ppm/° C. or more, and most preferably 2.92 ppm/° C. or more. In addition, $\alpha_{50/100}$ is more preferably 3.15 ppm/° C. or less, still more preferably 3.10 ppm/° C. or less, yet still more preferably 3.05 ppm/° C. or less, and most preferably 3.01 ppm/° C. or less.

In the glass substrate of the present invention, the glass transition temperature (sometimes referred to as Tg) is preferably 680° C. or more, more preferably 685° C. or more, still more preferably 690° C. or more. When Tg is 680° C. or more, the dimensional change of the glass substrate in the heat treatment step can be kept small. In addition, Tg is preferably 800° C. or less, more preferably 790° C. or less, and most preferably 780° C. or less. When Tg is 800° C. or less, the temperature of the forming apparatus can be lowered, and the life of the forming apparatus can be extended.

In the glass substrate of the present invention, the temperature (sometimes referred to as $T_2$) at which the viscosity becomes $10^2$ d·Pa·s is preferably 1,700° C. or less, more preferably 1,680° C. or less, still more preferably 1,660° C. or less. When $T_2$ is 1,700° C. or less, the viscosity during glass melting does not rise excessively, and the meltability is improved. Incidentally, considering easiness of ensuring other physical properties, $T_2$ is preferably 1,580° C. or more.

In the glass substrate of the present invention, the temperature (sometimes referred to as $T_4$) at which the viscosity becomes $10^4$ d·Pa·s is preferably 1,350° C. or less, more preferably 1,330° C. or less, still more preferably 1,310° C. or less. When $T_4$ is 1,350° C. or less, the forming of glass is facilitated. In addition, $T_4$ is preferably 1,200° C. or more, more preferably 1,250° C. or more, still more preferably 1,270° C. or more. When $T_4$ is 1,200° C. or more, the glass is not easily devitrified in the temperature region at the time of forming, and the productivity is enhanced.

In the glass substrate of the present invention, the devitrification temperature is preferably 1,350° C. or less, more preferably 1,330° C. or less, still more preferably 1,310° C. or less. Regarding the devitrification temperature of glass, pulverized glass particles are put in a platinum-made dish and heat-treated for 17 hours in an electric furnace controlled at a given temperature, and an average value between a maximum temperature causing precipitation of a crystal on the surface of and inside the glass and a minimum temperature causing no precipitation of a crystal, which are determined by observation with an optical microscope after the heat treatment, is employed.

In the glass substrate of the present invention, the devitrification viscosity ($\eta_{TL}$) is preferably $10^{3.8}$ d·Pa·s or more, more preferably $10^{3.9}$ d·Pa·s or more, still more preferably $10^{4.0}$ d·Pa·s or more. When the devitrification viscosity is $10^{3.8}$ d·Pa·s or more, forming can be stably performed.

The glass substrate of the present invention is sometimes incorporated as part of a device directly after lamination together with the silicon substrate. For example, the glass substrate is incorporated as a cover glass into a device. In such a case, the glass substrate is preferably subjected to slimming so as to make the device compact. Accordingly, the glass substrate in one embodiment of the present invention preferably has a higher slimming rate. An HF weight loss value can be used as an indicator of the slimming rate of the glass substrate.

Here, the HF weight loss value is a loss value per unit area and unit time [(mg/cm$^2$)/min] when immersing the glass substrate in an aqueous 5 mass % hydrofluoric acid solution at 25° C. In the glass substrate of the present invention, the weight loss value relative to an aqueous hydrofluoric acid solution (HF) (hereinafter, sometimes referred to as HF weight loss value) is preferably from 0.07 (mg/cm$^2$)/min or more, more preferably 0.09 (mg/cm$^2$)/min or more, still more preferably 0.11 (mg/cm$^2$)/min or more, and is preferably 0.20 (mg/cm$^2$)/min or less, more preferably 0.18 (mg/cm$^2$)/min or less, still more preferably 0.16 (mg/cm$^2$)/min or less.

When the HF weight loss value is 0.07 (mg/cm$^2$)/min or more, good productivity is favorably obtained in the slimming step. When the HF weight loss value is 0.20 (mg/cm$^2$)/min or less, a failure such that possible unevenness of the etching depth generated in the glass substrate in the slimming step impairs the smoothness of the glass substrate surface can be advantageously prevented.

The glass substrate of the present invention can be applied as a cover glass of a projection-use display device, for example, LCOS (Liquid Crystal On Silicon). In such a case, if the photoelastic constant of the glass substrate is high, the glass substrate has birefringence due to a stress generated in a device packaging step or in use of the device. As a result, a color change may be caused in light having entered the device, leading to an image quality failure such as color unevenness.

In order to prevent such an image quality failure, in the glass substrate of the present invention, the photoelastic constant is preferably 31.0 nm/(MPa·cm) or less, more preferably 30.5 nm/(MPa·cm) or less, still more preferably 30.0 nm/(MPa·cm) or less, yet still more preferably 29.5 nm/(MPa·cm) or less.

In the glass substrate of the present invention, the Vickers hardness is preferably 600 or less, more preferably 590 or less, still more preferably 580 or less. When the Vickers hardness is 600 or less, the grinding rate can be enhanced. In addition, the Vickers hardness is preferably 450 or more, more preferably 460 or more, still more preferably 470 or more. When the Vickers hardness is 450 or more, the susceptibility of the glass substrate to scratching can be reduced.

In the glass substrate of the present invention, the degree of wear is preferably 55 or more, more preferably 56 or more, still more preferably 57 or more. When the degree of wear is 55 or more, the grinding rate of the glass substrate can be raised. In addition, the degree of wear is preferably 100 or less, more preferably 95 or less, still more preferably 90 or less. When the degree of wear is 100 or less, damage due to contact with a silicon substrate, a peripheral member, etc. can be prevented.

In the glass substrate of the present invention, the thickness thereof is preferably 1.0 mm or less, more preferably 0.8 mm or less, still more preferably 0.7 mm or less, yet still more preferably 0.5 mm or less. When the thickness is 1.0 mm or less, an image sensor can be made compact.

In addition, the thickness is preferably 0.1 mm or more, more preferably 0.2 mm or more, still more preferably 0.3 mm or more. When the thickness is 0.1 mm or more, damage due to contact with a silicon substrate, a peripheral member, etc. can be prevented. Furthermore, self-weight deflection of the glass substrate can be suppressed.

In the glass substrate of the present invention, the area of at least one main surface is preferably 0.03 m$^2$ or more, more preferably 0.04 m$^2$ or more, still more preferably 0.05 m$^2$ or more. When the area is 0.03 m$^2$ or more, a large-area silicon substrate can be used, and a large number of image sensors can be manufactured from one sheet of the laminated substrate.

In the glass substrate of the present invention, the density of defects contained in the glass substrate is preferably 1 defect/cm$^2$ or less. The defect contained in the glass substrate includes a bubble, a scratch, a metal impurity such as platinum, an unmelted raw material, etc. existing on the surface of or inside the glass substrate and indicates a defect having a size of 1 mm or less and 0.5 μm or more. When the defect is larger than 1 mm, it can be easily discriminated with an eye, and a substrate having a defect can be easily excluded. When the defect is smaller than 0.5 μm, the defect is sufficiently small and less likely to affect the device properties even if the glass substrate is applied as a cover glass of an image sensor or LCOS.

In the conventional semiconductor fabrication process, the fabrication process is performed after cutting the glass substrate and therefore, in the case of containing a defect in a glass substrate, the substrate having a defect can be excluded in an early stage of the fabrication process. On the other hand, in the wafer-level packaging, since the laminated substrate is singulated at the end of the fabrication process, in the case of containing a defect in a glass substrate, the glass substrate having a defect can be excluded at the end of the fabrication process. Thus, in the wafer-level packaging, if the density of defects in the glass substrate is increased, the cost rises significantly and therefore, defect control at high level is required. The density of defects is more preferably 0.1 defects/cm$^2$ or less, still more preferably 0.01 defects/cm$^2$ or less.

The shape of the glass substrate of the present invention is not particularly limited and includes, for example, a circle, an ellipse, and a rectangle. In order to make the shape of the glass substrate conform to the shape of the silicon substrate, an end of the glass substrate may be formed with a notch and in the case where the glass substrate is circular, part of the outer periphery of the glass substrate may be a straight line.

In the glass substrate according to one embodiment of the present invention, the fictive viscosity is preferably from $10^{11.0}$ d·Pa·s to $10^{14.1}$ d·Pa·s. In order to adjust the fictive viscosity of the glass substrate to be from $10^{11.0}$ d·Pa·s to $10^{14.1}$ d·Pa·s, the cooling rate after forming of the glass substrate needs to be from 1° C./min to 1,200° C./min equivalent. When the fictive viscosity is from $10^{11.0}$ d·Pa·s to $10^{14.1}$ d·Pa·s, the average coefficient of thermal expansion of the glass substrate becomes close to the average coefficient of thermal expansion of the silicone substrate, and the residual strain generated in the silicon substrate in the heat treatment step of laminating together the silicon substrate and the glass substrate is small. The fictive viscosity of the glass substrate is more preferably from $10^{12.1}$ d·Pa·s to $10^{13.1}$ d·Pa·s (a cooling rate of 10° C./min to 100° C./min equivalent).

The fictive viscosity (η) of glass can be calculated according to the following formula [G. W. Scherer, "Relaxation in Glass and Composites", Wiley, New York (1986), p. 159]:

$$\log_{10}\eta = 12.3 - \log_{10}|q|$$

The unit of η is d·Pa·s, q is an estimated cooling rate, and the unit thereof is °C./s.

The estimated cooling rate q is determined from the glass substrate by the following method. A plurality of small glass plate pieces are cut out from one sheet of the glass substrate having a thickness of 1 mm or less. For example, a small piece of 1 cm square is cut out as the small glass plate piece. The plurality of small glass plate pieces cut out are heat-treated and cooled at various cooling rates V, and physical property values of each individual small glass plate piece are measured. The cooling start temperature is preferably a sufficiently high temperature not to be affected by the cooling rate and, typically, is preferably on the order of Tg+50° C. to +150° C.

The physical property values measured are not particularly limited, but a density, physical property values closely related to the density (for example, a refractive index), etc. are preferred. A calibration curve A is prepared by plotting the cooling rate ($\log_{10}$V) on the x-axis and plotting the physical property values of each individual heat-treated small glass plate piece on the y-axis. From the physical property values of each individual small glass plate piece not having been heat-treated, the estimated cooling rate q of the glass substrate is determined using the prepared calibration curve A.

In the glass substrate of the present invention, the value represented by the following formula (1) is preferably 3.10 or more, more preferably 3.20 or more, still more preferably 3.25 or more, yet still more preferably 3.30 or more. In addition, the value represented by the following formula (1) is preferably 3.70 or less, more preferably 3.60 or less, still more preferably 3.55 or less, yet still more preferably 3.50 or less. When the value represented by formula (1) is in the range above, $\alpha_{100/200}$ assumes a favorable value, and the difference in coefficient of thermal expansion from the silicon substrate can be reduced.

0.0181×(content of SiO$_2$)+0.0004×(content of Al$_2$O$_3$)+0.0387×(content of B$_2$O$_3$)+0.0913×(content of MgO)+0.1621×(content of CaO)+0.1900×(content of SrO)+0.2180×(content of BaO)+0.0424×(content of ZnO)+0.0391×(12.3+$\log_{10}$60−$\log_{10}$η)  Formula (1):

In the glass substrate of the present invention, the value represented by the following formula (2) is preferably 2.42 or more, more preferably 2.43 or more, still more preferably 2.44 or more, yet still more preferably 2.45 or more. In addition, the value represented by the following formula (2) is preferably 2.55 or less, more preferably 2.54 or less, still more preferably 2.53 or less.

When the value represented by formula (2) is in the range above, the density or brittleness of the glass substrate assumes a favorable value while ensuring the process margin, and the grinding rate and the polishing rate can be raised.

0.0218×(content of SiO$_2$)+0.0302×(content of Al$_2$O$_3$)+0.0181×(content of B$_2$O$_3$)+0.0330×(content of MgO)+0.0351×(content of CaO)+0.0488×(content of SrO)+0.0634×(content of BaO)+0.0419×(content of ZnO)  Formula (2):

In the glass substrate of the present invention, the value represented by the following formula (3) is preferably 76.0 or less, more preferably 75.5 or less, still more preferably 75.0 or less, yet still more preferably 74.0 or less. When the value represented by formula (3) is 76.0 or less, the toughness of the glass substrate is reduced while ensuring the process margin, and the grinding rate and the polishing rate can thereby be raised. In addition, damage due to contact with a silicon substrate, a peripheral member, etc. can be prevented.

0.677×(content of SiO$_2$)+1.598×(content of Al$_2$O$_3$)−0.220×(content of B$_2$O$_3$)+1.466×(content of MgO)+1.135×(content of CaO)+0.667×(content of SrO)+0.298×(content of BaO)+1.027×(content of ZnO)  Formula (3):

In the glass substrate of the present invention, the value represented by the following formula (4) is preferably 1.15 or more, more preferably 1.16 or more, still more preferably 1.17 or more, yet still more preferably 1.18 or more. In addition, the value represented by the following formula (4) is preferably 1.35 or less, more preferably 1.30 or less, still more preferably 1.28 or less, yet still more preferably less than 1.20.

The value represented by the following formula (4) may be 1.15 or more and less than 1.20, may be 1.16 or more and less than 1.20, or may be 1.18 or more and less than 1.20. When the value represented by formula (4) is in the range above, $\alpha_{200/300}/\alpha_{50/100}$ assumes a favorable value, and the difference in coefficient of thermal expansion from the silicon substrate can be reduced.

0.0111×(content of SiO$_2$)+0.0250×(content of Al$_2$O$_3$)+0.0078×(content of B$_2$O$_3$)+0.0144×(content of MgO)+0.0053×(content of CaO)+0.0052×(content of SrO)+0.0013×(content of BaO)+0.0121×(content of ZnO)−0.0041×(12.3+$\log_{10}$60−$\log_{10}$η)  Formula (4):

In the glass substrate of the present invention, the value represented by the following formula (5) is preferably 0.30 or more, more preferably 0.35 or more, still more preferably 0.40 or more. In addition, the value represented by the following formula (4) is preferably 1.20 or less, more preferably 1.00 or less, still more preferably 0.90 or less. When the value represented by formula (4) is in the range above, $\alpha_{200/300}/\alpha_{50/100}$ assumes a favorable value, and the difference in coefficient of thermal expansion from the silicon substrate can be reduced.

0.0368×(content of Al$_2$O$_3$)−0.0054×(content of B$_2$O$_3$)+0.0244×(content of MgO)+0.0143×(content of CaO)+0.0182×(content of SrO)+0.0097×(content of BaO)+0.097×(content of ZnO)−0.0032×(12.3+$\log_{10}$60−$\log_{10}$η)  Formula (5):

In the glass substrate of the present invention, it is preferred that the value represented by formula (1) is from 3.10 to 3.70, the value represented by formula (2) is 2.42 or more, and the value represented by formula (3) is 76.0 or less, and it is more preferred that the value represented by formula (4) is from 1.15 to 1.35 and the value represented by formula (5) is from 0.30 to 1.20.

In addition, in the glass substrate according to one embodiment of the present invention, an α-ray emission amount is preferably 0.5 C/cm$^2$·h or less, more preferably 0.3 C/cm$^2$·h or less, still more preferably 0.1 C/cm$^2$·h or less, and most preferably 0.05 C/cm$^2$·h or less. The unit C means the number of counts.

For example, the glass substrate according to one embodiment of the present invention is applied to a cover glass of a device such as image sensor. In this case, when an α-ray generated from the glass substrate enters a device such as image sensor, a hole-electron pair may be induced by the energy of α-ray, giving rise to occurrence of a soft error that is a ray effect of instantaneously producing a bright spot or a white spot on an image. Therefore, use of a glass substrate with a small α-ray emission amount is likely to prevent such a trouble. When a high-purity raw material having a small radioactive isotope content and a small α-ray emission amount is used as a raw material of the glass substrate, the α-ray emission amount can be decreased. Furthermore, in a melting/refining step of glass, when a radioactive isotope is prevented from getting mixed in with the molten glass from a furnace material, etc. of a glass manufacturing facility, the α-ray emission amount can be effectively decreased. The "α-ray emission amount" can be measured by a gas flow proportional counter measuring apparatus, etc.

The laminated substrate of the present invention is formed through stacking of the above-described glass substrate and a silicon substrate. Since the difference in coefficient of thermal expansion between the silicon substrate and the glass substrate is small, the residual strain generated in the silicon substrate in the heat treatment step of laminating together the silicon substrate and the glass substrate is small. In addition, the laminated substrate is obtained by, for example, laminating together the glass substrate and the silicon substrate while interposing a resin therebetween.

At this time, the resin thickness, the coefficient of thermal expansion of resin, the heat treatment temperature at the time of lamination together, etc. may affect warpage of the whole laminated substrate. In the laminated substrate of the present invention, the warpage of the whole laminated substrate can be reduced by controlling the coefficient of thermal expansion as in the above-described glass substrate according to one embodiment of the present invention, so that the process margin such as resin thickness, coefficient of thermal expansion of resin and heat treatment temperature at the time of lamination together can be broadened. In the laminated substrate of the present invention, the glass substrate of the present invention described above can be applied.

The method for manufacturing the glass substrate of the present invention is described below. In the case of manufacturing the glass substrate of the present invention, the method includes a melting step of heating glass raw materials to obtain a molten glass, a refining step of removing bubbles from the molten glass, a forming step of forming the molten glass into a sheet-like shape to obtain a glass ribbon, and a slow cooling step of gradually cooling the glass ribbon to a room temperature state.

In the melting step, raw materials are prepared so as to afford a composition of the glass sheet obtained, and the raw materials are continuously charged into a melting furnace and heated preferably at approximately from 1,450 to 1,650° C. to obtain a molten glass.

As the raw material, for example, an oxide, a carbonate, a nitrate, a hydroxide, and a halide such as chloride can be used. In the case where the melting or refining step includes a step of putting the molten glass into contact with platinum, a minute platinum particle may dissolve out into the molten glass and be mixed as an impurity in the glass sheet obtained, but use of a nitrate raw material is effective in preventing the platinum impurity from dissolving out.

As the nitrate, strontium nitrate, barium nitrate, magnesium nitrate, calcium nitrate, etc. can be used. Use of strontium nitrate is more preferred. As for the particle size of the raw material, from a raw material having a large particle diameter of several hundred microns to the extent of not causing an unmelted residue to a raw material having a small particle diameter of about several microns to the extent of causing no scattering during transportation of raw materials and no aggregation as a secondary particle can be appropriately used. A granulated form can also be used. The moisture content of the raw material can also be appropriately adjusted so as to prevent scattering of raw materials. In addition, the melting conditions such as β-OH and oxidation-reduction degree or redox of Fe [$Fe^{2+}/(Fe^{2+}+Fe^{3+})$] can be appropriately adjusted and used.

Next, the refining step is a step of removing bubbles from the molten glass obtained in the above-described melting step. As the refining step, a defoaming process by pressure reduction may be applied. Furthermore, in the glass substrate in the present invention, $SO_3$ or $SnO_2$ can be used as a refining agent. As the $SO_3$ source, a sulfate of at least one element selected from Al, Mg, Ca, Sr and Ba is preferred; a sulfate of an alkaline earth metal is more preferred; and above all, $CaSO_4.2H_2O$, $SrSO_4$ and $BaSO_4$ are still more preferred because of their remarkable action of making the bubble large.

As the refining agent in the defoaming process by pressure reduction, it is preferred to use a halogen such as Cl and F. As the Cl source, a chloride of at least one element selected from Al, Mg, Ca, Sr and Ba is preferred; a chloride of an alkaline earth metal is more preferred; and above all, $SrCl_2.6H_2O$ and $BaCl_2.2H_2O$ are still more preferred because of their remarkable action of making the bubble large and their small deliquescency. As the F source, a fluoride of at least one element selected from Al, Mg, Ca, Sr and Ba is preferred; a fluoride of an alkaline earth metal is more preferred; and above all, $CaF_2$ is still more preferred because of its remarkable action of increasing the meltability of glass raw materials.

Next, the forming step is a step of forming the molten glass deprived of bubbles in the refining step above into a sheet-like shape to obtain a glass ribbon. As the forming step, a float process of flowing the molten glass on a molten metal and thereby forming it into a sheet-like shape to obtain a glass ribbon is applied.

Next, the slow cooling step is a step of gradually cooling the glass ribbon obtained in the forming step above to a room temperature state. In the slow cooling step, the glass ribbon is gradually cooled to a room temperature state such that the average cooling rate from a temperature at which the viscosity is $10^{13}$ d·Pa·s to a temperature at which the viscosity is $10^{14.5}$ d·Pa·s becomes R. The gradually cooled glass ribbon is cut to obtain a glass substrate.

In the method for manufacturing the glass substrate of the present invention, the composition of the obtained alkali-free glass substrate contains, as represented by molar percentage based on oxides, 11.0% or more of $Al_2O_3$, 8.0% or more of $B_2O_3$, and 1% or more of SrO, and the composition of the obtained glass substrate and the average cooling rate R (unit: ° C./min) from a temperature at which the viscosity of the glass ribbon in the slow cooling step becomes $10^{13}$ d·Pa·s to a temperature at which the viscosity becomes $10^{14.5}$ d·Pa·s satisfy the following conditions (1) to (3). By satisfying the conditions (1) to (3), a glass substrate having succeeded in enhancing the grinding/polishing rate and reducing the residual strain generated in the silicon substrate in the heat treatment step can be manufactured.

0.0181×(content of $SiO_2$)+0.0004×(content of $Al_2O_3$)+0.0387×(content of $B_2O_3$)+0.0913× (content of MgO)+0.1621×(content of CaO)+ 0.1900×(content of SrO)+0.2180×(content of BaO)+0.0424×(content of ZnO)+0.0391×$\log_{10}$R is from 3.10 to 3.70.    Condition (1):

0.0218×(content of $SiO_2$)+0.0302×(content of $Al_2O_3$)+0.0181×(content of $B_2O_3$)+0.0330×

(content of MgO)+0.0351×(content of CaO)+
0.0488×(content of SrO)+0.0634×(content of
BaO)+0.0419×(content of ZnO) is 2.42 or more.    Condition (2):

0.677×(content of SiO$_2$)+1.598×(content of Al$_2$O$_3$)−
0.220×(content of B$_2$O$_3$)+1.466×(content of
MgO)+1.135×(content of CaO)+0.667×(content
of SrO)+0.298×(content of BaO)+1.027×(content of ZnO) is 76.0 or less.    Condition (3):

Furthermore, in the method for manufacturing the glass substrate of the present invention, it is preferred that the composition of the obtained glass substrate further satisfies the following condition (4). By satisfying the conditions (4) and (5), the residual strain generated in the silicon substrate in the heat treatment step can be reduced.

0.0111×(content of SiO$_2$)+0.0250×(content of
Al$_2$O$_3$)+0.0078×(content of B$_2$O$_3$)+0.0144×
(content of MgO)+0.0053×(content of CaO)+
0.0052×(content of SrO)+0.0013×(content of
BaO)+0.0121×(content of ZnO)−0.0041×log$_{10}$R
is from 1.15 to 1.35.    Condition (4):

0.0368×(content of Al$_2$O$_3$)−0.0054×(content of
B$_2$O$_3$)+0.0244×(content of MgO)+0.0143×(content of CaO)+0.0182×(content of SrO)+0.0097×
(content of BaO)+0.097×(content of ZnO)−
0.0032×log$_{10}$R is from 0.30 to 1.20.    Condition (5):

The value represented by condition (1) is more preferably 3.20 or more, still more preferably 3.25 or more, yet still more preferably 3.30 or more. In addition, the value represented by condition (1) is preferably 3.70 or less, more preferably 3.60 or less, still more preferably 3.55 or less, yet still more preferably 3.50 or less. When the value represented by condition (1) is in the range above, a glass substrate having a small difference in the coefficient of thermal expansion from the silicon substrate can be manufactured.

The value represented by condition (2) is more preferably 2.43 or more, still more preferably 2.44 or more, yet still more preferably 2.45 or more. In addition, the value represented by condition (2) is preferably 2.55 or less, more preferably 2.54 or less, still more preferably 2.53 or less. When the value represented by condition (2) is in the range above, a glass substrate having relatively high brittleness and good grindability/polishability can be manufactured.

The value represented by condition (3) is more preferably 75.5 or less, still more preferably 75.0 or less, yet still more preferably 74.0 or less. When the value represented by condition (3) is in the range above and 76.0 or less, a glass substrate having relatively low toughness and good grindability/polishability while ensuring the process margin can be manufactured.

The value represented by condition (4) is more preferably 1.16 or more, still more preferably 1.17 or more, yet still more preferably 1.18 or more. In addition, the value represented by condition (4) is preferably 1.30 or less, more preferably 1.28 or less, still more preferably less than 1.20. The value represented by condition (4) may be 1.15 or more and less than 1.20, may be 1.16 or more and less than 1.20, or may be 1.18 or more and less than 1.20. When the value represented by condition (4) is in the range above, a glass substrate having a small difference in the coefficient of thermal expansion from the silicon substrate can be manufactured.

The value represented by condition (5) is more preferably 0.35 or more, still more preferably 0.40 or more. In addition, the value represented by condition (4) is preferably 1.20 or less, more preferably 1.00 or less, still more preferably 0.90 or less. When the value represented by condition (4) is in the range above, a glass substrate having a small difference in the coefficient of thermal expansion from the silicon substrate can be manufactured.

The present invention is not limited to the above-described embodiments. Modifications, improvements, etc. within the range where the object of the present invention can be achieved are included in the present invention.

For example, in the case of manufacturing the glass substrate of the present invention, the molten glass may be formed into a sheet-like shape by applying a fusion process, a press forming process, etc. in the forming step.

Furthermore, in the case of manufacturing the glass substrate of the present invention, a platinum crucible may be used. In the case of using a platinum crucible, in the melting step, raw materials are prepared to afford a composition of the glass substrate obtained, a platinum crucible containing the raw materials is charged into an electric furnace and heated preferably at approximately from 1,450° C. to 1,650° C. A platinum stirrer is inserted, and stirring is performed for 1 hour to 3 hours to obtain a molten glass.

In the forming step, the molten glass is cast on a carbon plate and formed into a sheet-like shape. In the slow cooling step, the sheet-like glass is gradually cooled to a room temperature state and then cut to obtain a glass substrate. In addition, the glass substrate obtained by cutting may be heated to, for example, approximately Tg+50° C. and then gradually cooled at a predetermined cooling rate to a room temperature state. The fictive viscosity η can thereby be adjusted.

EXAMPLES

The present invention is specifically described below by referring to Examples, but the present invention is not limited to these Examples.

Various glass raw materials such as silica sand were mixed to afford a glass composition (target composition) shown in Tables 1 to 6, and, as represented by molar percentage based on oxides, from 0.1% to 1% of a sulfate in terms of SO$_3$, 0.16% of F, and 1% of Cl were added per 100% of raw materials of the prepared target composition. The raw materials were put in a platinum crucible and melted by heating in an electric furnace at a temperature of 1,550° C. to 1,650° C. for 3 hours to obtain a molten glass. In the melting, a platinum stirrer was put into the platinum crucible, and stirring was performed for 1 hour to achieve homogenization of glass. The molten glass was cast on a carbon plate and formed into a sheet-like shape, the sheet-like glass was put in an electric furnace at a temperature of about Tg+50° C., and the electric furnace was subjected to temperature drop at a cooling rate R (° C./min) and cooled until the glass reached room temperature.

The obtained glass was evaluated for the fictive viscosity log$_{10}$η (unit: d·Pa·sec), the values determined according to the following formulae (1) to (5), the average coefficient of thermal expansion (unit: ppm/° C.), the density (unit: g/cm$^3$), the Young's modulus (unit: GPa), the Vickers hardness, the degree of wear, the glass transition temperature Tg (unit: ° C.), T$_2$ (unit: ° C.), T$_4$ (unit: ° C.), the devitrification temperature (unit: ° C.), the devitrification viscosity log$_{10}$η$_{TL}$ (unit: d·Pa·sec), the HF weight loss value [unit: (mg/cm$^2$)/min], and the photoelastic constant [unit: nm/(MPa·cm)]. The results are shown in Tables 1 to 6.

0.0181×(content of SiO$_2$)+0.0004×(content of
Al$_2$O$_3$)+0.0387×(content of B$_2$O$_3$)+0.0913×
(content of MgO)+0.1621×(content of CaO)+

0.1900×(content of SrO)+0.2180×(content of BaO)+0.0424×(content of ZnO)+0.0391×(12.3+log₁₀60−log₁₀).     Formula (1):

0.0218×(content of SiO₂)+0.0302×(content of Al₂O₃)+0.0181×(content of B₂O₃)+0.0330×(content of MgO)+0.0351×(content of CaO)+0.0488×(content of SrO)+0.0634×(content of BaO)+0.0419×(content of ZnO).     Formula (2):

0.677×(content of SiO₂)+1.598×(content of Al₂O₃)−0.220×(content of B₂O₃)+1.466×(content of MgO)+1.135×(content of CaO)+0.667×(content of SrO)+0.298×(content of BaO)+1.027×(content of ZnO).     Formula (3):

0.0111×(content of SiO₂)+0.0250×(content of Al₂O₃)+0.0078×(content of B₂O₃)+0.0144×(content of MgO)+0.0053×(content of CaO)+0.0052×(content of SrO)+0.0013×(content of BaO)+0.0121×(content of ZnO)−0.0041×(12.3+log₁₀60−log₁₀η).     Formula (4):

0.0368×(content of Al₂O₃)−0.0054×(content of B₂O₃)+0.0244×(content of MgO)+0.0143×(content of CaO)+0.0182×(content of SrO)+0.0097×(content of BaO)+0.097×(content of ZnO)−0.0032×(12.3+log₁₀60−log₁₀η).     Formula (5):

In the Tables, the values in parentheses are determined by calculation. The residual amount of $Fe_2O_3$ in the glass was from 50 ppm to 200 ppm as represented by mass ppm based on oxides, and the residual amount of $SO_3$ in the glass was from 10 ppm to 100 ppm as represented by mass ppm based on oxides. Measurement methods of respective physical properties are described below.

(Fictive Viscosity)

The fictive viscosity was calculated using the above-described formula [G. W. Scherer, "Relaxation in Glass and Composites", Wiley, New York (1986), p. 159].

(Average Coefficient of Thermal Expansion)

The average coefficient of thermal expansion was measured using a differential dilatometer (TMA) in accordance with the method prescribed in JIS R3102 (1995). The measurement temperature range is from 50 to 100° C. for $α_{50}/α_{100}$, from 100 to 200° C. for $α_{100}/α_{200}$, and from 200 to 300° C. for $α_{200}/α_{300}$.

(Average Coefficient of Thermal Expansion of Silicon Substrate)

The average coefficient of thermal expansions of a silicon substrate (manufactured by Shin-Etsu Chemical Co., Ltd.) are shown in Table 7. In the silicon substrate, $α_{Si50/100}$ was 2.94 ppm/° C., $α_{Si100/200}$ was 3.37 ppm/° C., $α_{Si200/300}$ was 3.69 ppm/° C., $α_{Si200/300}/α_{Si50/100}$ was 1.25, and $α_{Si200/300}/α_{Si50/100}$ was 0.75 ppm/° C. The average coefficient of thermal expansions of the silicon substrate are typically the values shown in Table 7.

(Density)

About 20 g of a bubble-free glass block was measured by the Archimedean method.

(Young's Modulus)

A glass having a thickness of 0.5 mm to 10 mm was measured by the ultrasonic pulse method.

(Vickers Hardness)

The Vickers hardness was measured under a normal-temperature normal-humidity environment (in this case, kept at room temperature of 25° C. and a humidity of 60% RH) by using a Vickers hardness tester (MICRO HARDNESS TESTER HMV-2) manufactured by SHIMADZU Corporation in conformity with the test method prescribed in JIS-Z-2244 (2009) (ISO6507-1, ISO6507-4, ASTM-E-384). The measurement was performed at 10 points per sample, and an average thereof is employed as the Vickers hardness of the test sample. In addition, an indentation was formed by using a Vickers indenter under an indentation load of 0.98 N for 15 seconds.

(Degree of Wear)

As an indicator of the grinding rate, the degree of wear was measured using the measurement method described in Japan Optical Glass Manufacturers' Association (JOGMA) Standards J10-1994, "Method for Measuring Degree of wear of Optical Glass".

(Glass Transition Temperature Tg)

The glass transition temperature was measured using TMA in accordance with the method prescribed in JIS R3103-3 (2001).

($T_2$)

The viscosity was measured by means of a rotary viscometer, and the temperature $T_2$ (° C.) at which the viscosity became $10^2$ d·Pa·s was measured.

($T_4$)

The viscosity was measured by means of a rotary viscometer, and the temperature $T_4$ (° C.) at which the viscosity became $10^4$ d·Pa·s was measured.

(Devitrification Temperature)

As for the devitrification temperature, pulverized glass particles were put in a platinum-made dish and heat-treated for 17 hours in an electric furnace controlled at a given temperature, and an average value between a maximum temperature causing precipitation of a crystal on the surface of or inside the glass and a minimum temperature causing no precipitation of a crystal on the surface of or inside the glass, which were determined by observation with an optical microscope after the heat treatment, was employed.

(Devitrification Viscosity)

A coefficient of the Fulcher equation was determined from the results on measuring the glass viscosity of the molten glass at a high temperature (from 1,000° C. to 1,600° C.) by using a rotary viscometer, and the glass devitrification viscosity (glass viscosity at the glass devitrification temperature) was determined according to the Fulcher equation using the coefficient.

(HF Weight Loss Value)

The HF weight loss value was measured as follows. A glass sheet obtained as described above was cut, and both surfaces thereof were mirror-polished to obtain a 40 mm-square glass sample of 1 mm in thickness. This glass sample was washed and then dried, and the weight thereof was measured. Subsequently, the glass sample was immersed in an aqueous 5 mass % hydrofluoric acid solution kept at 25° C. for 20 minutes, washed, and then dried, and the weight thereof was measured. The weight loss value between before immersing and after immersing was calculated. If a chemical liquid is stirred during immersing, the etching rate fluctuates, and stirring was therefore not conducted. The surface area was calculated from the sample dimensions, and the weight loss value was divided by the surface area and further divided by the immersing time to determine the weight loss value (HF weight loss value) per unit area and unit time.

(Photoelastic Constant)

The photoelastic constant was measured by the circular plate compression method ("Measurement of Photoelastic Constant of Glass for Chemical Strengthening by Method of Compression on Circular Plate", Ryosuke Yokota, Journal of Ceramic Association, Japan, 87[10], 1979, pp. 519-522).

TABLE 1

| mol % | Ex. 1 | Ex. 2 | Ex. 3 | Ex. 4 | Ex. 5 | Ex. 6 | Ex. 7 | Ex. 8 | Ex. 9 | Ex. 10 | Ex. 11 | Ex. 12 |
|---|---|---|---|---|---|---|---|---|---|---|---|---|
| $SiO_2$ | 68.4 | 58.2 | 64.5 | 65.8 | 66.0 | 60.0 | 64.2 | 65.1 | 64.8 | 65.6 | 65.3 | 65.7 |
| $Al_2O_3$ | 12.5 | 12.0 | 16.0 | 16.0 | 12.1 | 13.5 | 12.8 | 13.0 | 13.0 | 12.5 | 12.5 | 12.4 |
| $B_2O_3$ | 8.0 | 15.0 | 9.2 | 9.2 | 9.7 | 14.5 | 10.7 | 9.8 | 11.3 | 9.7 | 11.2 | 9.7 |
| MgO | 1.5 | 9.8 | 0 | 0 | 5.5 | 5.7 | 6.5 | 4.2 | 2.1 | 4.4 | 2.9 | 4.4 |
| CaO | 5.0 | 3.0 | 4.6 | 0 | 1.0 | 1.0 | 1.0 | 1.5 | 1.8 | 2.0 | 1.1 | 1.6 |
| SrO | 4.3 | 2.0 | 2.5 | 2.5 | 5.8 | 5.3 | 1.4 | 6.4 | 7.0 | 5.8 | 7.0 | 5.0 |
| BaO | 0.3 | 0 | 3.2 | 6.5 | 0 | 0 | 3.4 | 0 | 0 | 0 | 0 | 1.2 |
| ZnO | 0 | 0 | 0 | 0 | 0 | 0 | 0 | 0 | 0 | 0 | 0 | 0 |
| MgO + CaO | 6.5 | 12.8 | 4.6 | 0 | 6.5 | 6.7 | 7.5 | 5.7 | 3.8 | 6.4 | 4.0 | 6.0 |
| MgO + CaO + SrO + BaO + ZnO | 11.1 | 14.8 | 10.3 | 9.0 | 12.3 | 12.0 | 12.3 | 12.1 | 10.8 | 12.2 | 11.0 | 12.2 |
| Cooling rate R (° C./min) | 1 | 1 | 1 | 1 | 40 | 40 | 40 | 1 | 1 | 1 | 1 | 1 |
| Fictive viscosity $\log_{10}\eta$ (d·Pa·s) | 14.1 | 14.1 | 14.1 | 14.1 | 12.5 | 12.5 | 12.5 | 14.1 | 14.1 | 14.1 | 14.1 | 14.1 |
| (1) | 3.37 | 3.40 | 3.45 | 3.45 | 3.40 | 3.40 | 3.41 | 3.40 | 3.42 | 3.39 | 3.39 | 3.44 |
| (2) | 2.47 | 2.43 | 2.54 | 2.62 | 2.48 | 2.46 | 2.51 | 2.49 | 2.48 | 2.48 | 2.48 | 2.50 |
| (3) | 75.4 | 74.4 | 75.1 | 71.7 | 74.8 | 72.1 | 74.2 | 74.9 | 71.9 | 74.8 | 71.9 | 74.1 |
| (4) | 1.21 | 1.23 | 1.23 | 1.22 | 1.22 | 1.23 | 1.22 | 1.23 | 1.21 | 1.22 | 1.21 | 1.21 |
| (5) | 0.61 | 0.68 | 0.68 | 0.65 | 0.64 | 0.66 | 0.64 | 0.67 | 0.62 | 0.65 | 0.61 | 0.64 |
| $\alpha_{100/200}$ | (3.36) | (3.40) | (3.44) | (3.45) | 3.37 | 3.43 | 3.33 | (3.38) | (3.48) | (3.36) | (3.39) | (3.43) |
| $\alpha_{200/300}/\alpha_{50/100}$ | (1.20) | (1.25) | (1.23) | (1.22) | 1.21 | 1.21 | 1.20 | (1.20) | (1.19) | (1.18) | (1.18) | (1.21) |
| $\alpha_{200/300}-\alpha_{50/100}$ | (0.60) | (0.72) | (0.69) | (0.68) | 0.63 | 0.63 | 0.59 | (0.59) | (0.58) | (0.55) | (0.56) | (0.65) |
| Density (g/cm³) | (2.47) | (2.43) | (2.55) | (2.62) | 2.47 | 2.46 | 2.52 | (2.49) | (2.48) | (2.48) | (2.48) | (2.51) |
| Young's modulus (GPa) | (75.4) | (74.4) | (75.1) | (71.7) | 75.7 | 73.7 | 75.6 | 75.3 | 72.5 | 75.1 | 72.5 | (74.1) |
| Vickers hardness | (564) | (564) | (548) | (527) | (565) | (549) | (553) | (563) | (550) | 550 | (551) | (559) |
| Glass transition temperature Tg (° C.) | (728) | (647) | (736) | (739) | (704) | (664) | (700) | 722 | 717 | 723 | 714 | (707) |
| $T_2$ (° C.) | (1709) | (1534) | (1682) | (1725) | (1660) | (1580) | (1652) | 1642 | 1649 | 1647 | 1657 | (1667) |
| $T_4$ (° C.) | (1317) | (1175) | (1310) | (1339) | (1279) | (1217) | (1270) | 1282 | 1274 | 1284 | 1288 | (1285) |
| Devitrification temperature (° C.) | | | | | 1310 | 1315 | 1315 | 1305 | 1320 | 1285 | 1320 | |
| Devitrification viscosity $\log_{10}\eta_{TL}$ (d·Pa·s) | | | | | 3.8 | 3.3 | 3.7 | 3.8 | 3.7 | 4.0 | 3.8 | |
| HF Weight loss value ((mg/cm²)/min) | (0.11) | (0.22) | (0.18) | (0.17) | 0.13 | 0.18 | 0.15 | (0.15) | (0.16) | (0.15) | (0.15) | (0.15) |
| Photoelastic constant (nm/(MPa·cm)) | (32.1) | (33.6) | (30.7) | (29.9) | (32.3) | (33.6) | (31.4) | (32.0) | (33.0) | (32.2) | (33.0) | (31.9) |

TABLE 2

| mol % | Ex. 13 | Ex. 14 | Ex. 15 | Ex. 16 | Ex. 17 | Ex. 18 | Ex. 19 | Ex. 20 | Ex. 21 | Ex. 22 | Ex. 23 | Ex. 24 |
|---|---|---|---|---|---|---|---|---|---|---|---|---|
| $SiO_2$ | 65.6 | 65.8 | 65.8 | 65.6 | 65.6 | 69.0 | 68.5 | 69.0 | 69.5 | 67.6 | 67.3 | 67.5 |
| $Al_2O_3$ | 12.5 | 12.5 | 12.5 | 12.5 | 12.5 | 12.5 | 12.5 | 13.0 | 12.5 | 11.7 | 12.0 | 11.8 |
| $B_2O_3$ | 9.6 | 9.9 | 9.9 | 9.7 | 9.7 | 8.0 | 9.0 | 7.5 | 7.5 | 8.4 | 9.2 | 9.6 |
| MgO | 2.0 | 4.7 | 4.5 | 4.4 | 4.4 | 0.5 | 0.5 | 0.5 | 0 | 4.0 | 4.0 | 4.0 |
| CaO | 1.6 | 2.0 | 2.0 | 2.0 | 2.0 | 7.5 | 6.5 | 6.5 | 6.0 | 5.1 | 4.6 | 4.8 |
| SrO | 6.4 | 5.1 | 5.3 | 5.8 | 5.8 | 1.5 | 2.0 | 2.0 | 1.5 | 1.5 | 1.5 | 2.3 |
| BaO | 0 | 0 | 0 | 0 | 0 | 1.0 | 1.0 | 1.5 | 3.0 | 1.7 | 1.4 | 0 |
| ZnO | 2.3 | 0 | 0 | 0 | 0 | 0 | 0 | 0 | 0 | 0 | 0 | 0 |
| MgO + CaO | 3.6 | 6.7 | 6.5 | 6.4 | 6.4 | 8.0 | 7.0 | 7.0 | 6.0 | 9.1 | 8.6 | 8.8 |
| MgO + CaO + SrO + BaO + ZnO | 12.3 | 11.8 | 11.8 | 12.2 | 12.2 | 10.5 | 10.0 | 10.5 | 10.5 | 12.3 | 11.5 | 11.1 |
| Cooling rate R (° C./min) | 40 | 100 | 40 | 40 | 100 | 200 | 200 | 300 | 400 | 300 | 400 | 500 |
| Fictive viscosity $\log_{10}\eta$ (d·Pa·s) | 12.5 | 12.1 | 12.5 | 12.5 | 12.1 | 11.8 | 11.8 | 11.6 | 11.5 | 11.6 | 11.5 | 11.4 |
| (1) | 3.38 | 3.38 | 3.38 | 3.46 | 3.47 | 3.42 | 3.38 | 3.45 | 3.57 | 3.50 | 3.38 | 3.28 |
| (2) | 2.51 | 2.47 | 2.47 | 2.48 | 2.48 | 2.44 | 2.44 | 2.47 | 2.50 | 2.47 | 2.45 | 2.41 |
| (3) | 73.6 | 74.8 | 74.7 | 74.8 | 74.8 | 75.5 | 74.1 | 75.7 | 74.1 | 75.8 | 75.2 | 75.3 |
| (4) | 1.21 | 1.22 | 1.22 | 1.21 | 1.21 | 1.19 | 1.19 | 1.19 | 1.18 | 1.19 | 1.20 | 1.20 |
| (5) | 0.61 | 0.64 | 0.64 | 0.64 | 0.64 | 0.57 | 0.56 | 0.59 | 0.55 | 0.59 | 0.59 | 0.58 |
| $\alpha_{100/200}$ | (3.36) | 3.36 | (3.37) | (3.44) | (3.46) | (3.40) | (3.36) | (3.43) | (3.56) | (3.49) | (3.37) | (3.26) |
| $\alpha_{200/300}/\alpha_{50/100}$ | (1.20) | 1.21 | (1.21) | (1.21) | (1.21) | (1.19) | (1.19) | (1.19) | (1.18) | (1.20) | (1.20) | (1.20) |
| $\alpha_{200/300}-\alpha_{50/100}$ | (0.61) | 0.61 | (0.64) | (0.64) | (0.64) | (0.56) | (0.56) | (0.58) | (0.56) | (0.61) | (0.60) | (0.59) |
| Density (g/cm³) | (2.51) | 2.47 | (2.47) | (2.48) | (2.48) | (2.45) | (2.44) | (2.47) | (2.50) | (2.47) | (2.45) | (2.42) |
| Young's modulus (GPa) | (73.7) | 75.7 | (74.8) | 75.1 | 75.1 | (75.5) | (74.1) | (75.8) | (74.1) | (75.8) | (75.2) | (75.3) |
| Vickers hardness | | 550 | (563) | (564) | (564) | (561) | (555) | (561) | (553) | (566) | (562) | (564) |
| Glass transition temperature Tg(° C.) | | 719 | (706) | 723 | 723 | (731) | (722) | (738) | (737) | (719) | (714) | (709) |
| $T_2$ (° C.) | | 1657 | (1662) | 1647 | 1647 | (1722) | (1717) | (1727) | (1744) | (1693) | (1689) | (1684) |
| $T_4$ (° C.) | | 1289 | (1281) | 1284 | 1284 | (1323) | (1317) | (1330) | (1340) | (1299) | (1295) | (1290) |
| Devitrification temperature (° C.) | | 1300 | | 1285 | 1285 | | | | | | | |
| Devitrification viscosity $\log_{10}\eta_{TL}$ (d·Pa·s) | | 4.0 | | 4.0 | 4.0 | | | | | | | |
| HF Weight loss value ((mg/cm²)/min) | | (0.14) | (0.14) | (0.15) | (0.15) | (0.11) | (0.11) | (0.11) | (0.12) | (0.13) | (0.12) | (0.11) |
| Photoelastic constant (nm/(MPa·cm)) | | (32.5) | (32.4) | (32.2) | (32.2) | (32.3) | (32.8) | (31.7) | (31.4) | (31.8) | (32.3) | (33.1) |

TABLE 3

| mol % | Ex. 25 | Ex. 26 | Ex. 27 | Ex. 28 | Ex. 29 | Ex. 30 | Ex. 31 | Ex. 32 | Ex. 33 | Ex. 34 | Ex. 35 | Ex. 36 |
|---|---|---|---|---|---|---|---|---|---|---|---|---|
| $SiO_2$ | 68.0 | 64.8 | 65.0 | 61.8 | 60.7 | 66.1 | 68.6 | 69.3 | 64.8 | 64.2 | 70.0 | 65.9 |
| $Al_2O_3$ | 11.8 | 12.7 | 12.2 | 14.0 | 14.5 | 11.3 | 11.4 | 12.4 | 13.0 | 10.0 | 7.5 | 12.9 |
| $B_2O_3$ | 8.5 | 9.2 | 12.1 | 14.0 | 15.8 | 7.8 | 7.9 | 5.7 | 15.5 | 16.2 | 2.4 | 6.2 |
| MgO | 3.6 | 0.5 | 3.2 | 2.2 | 1.0 | 5.1 | 2.5 | 3.3 | 0.0 | 2.2 | 8.0 | 8.0 |
| CaO | 4.6 | 1.0 | 1.5 | 1.0 | 1.0 | 4.5 | 9.1 | 7.1 | 9.7 | 3.2 | 5.6 | 4.0 |
| SrO | 3.5 | 6.8 | 4.2 | 7.0 | 4.3 | 5.2 | 0.5 | 1.3 | 0 | 6.7 | 2.0 | 3.0 |
| BaO | 0 | 0 | 1.2 | 0 | 2.7 | 0 | 0 | 0.9 | 0 | 0 | 0 | 0 |
| ZnO | 0 | 5.0 | 0.6 | 0 | 0 | 0 | 0 | 0 | 0 | 0 | 0 | 0 |
| MgO + CaO | 8.2 | 1.5 | 4.7 | 3.2 | 2.0 | 9.7 | 11.6 | 10.4 | 9.7 | 5.4 | 13.6 | 12.0 |
| MgO + CaO + SrO + BaO + ZnO | 11.7 | 13.3 | 10.7 | 10.2 | 9.0 | 14.8 | 12.1 | 12.6 | 9.7 | 12.1 | 15.6 | 15.0 |
| Cooling rate R (° C./min) | 600 | 40 | 400 | 40 | 1 | 40 | 670 | 300 | 1 | 1 | 1 | 1 |
| Fictive viscosity $\log_{10}\eta$ (d·Pa·s) | 11.3 | 12.5 | 11.5 | 12.5 | 14.1 | 12.5 | 11.3 | 11.6 | 14.1 | 14.1 | 14.1 | 14.1 |
| (1) | 3.41 | 3.31 | 3.37 | 3.42 | 3.37 | 3.75 | 3.46 | 3.47 | 3.35 | 3.78 | 3.39 | 3.39 |
| (2) | 2.44 | 2.56 | 2.47 | 2.47 | 2.50 | 2.50 | 2.41 | 2.47 | 2.34 | 2.43 | 2.49 | 2.49 |
| (3) | 75.9 | 73.7 | 71.0 | 70.2 | 67.1 | 77.2 | 77.2 | 79.5 | 67.4 | 63.2 | 85.5 | 82.2 |
| (4) | 1.20 | 1.21 | 1.19 | 1.21 | 1.21 | 1.19 | 1.18 | 1.21 | 1.14 | 1.11 | 1.25 | 1.25 |
| (5) | 0.60 | 0.61 | 0.57 | 0.63 | 0.59 | 0.65 | 0.57 | 0.63 | 0.42 | 0.41 | 0.74 | 0.75 |
| $\alpha_{100/200}$ | (3.39) | (3.28) | (3.36) | (3.40) | (3.37) | 3.75 | 3.45 | (3.46) | (3.34) | (3.79) | 3.35 | 3.36 |
| $\alpha_{200/300}/\alpha_{50/100}$ | (1.20) | (1.20) | (1.20) | (1.21) | (1.21) | 1.19 | 1.18 | (1.21) | (1.15) | (1.13) | 1.27 | 1.24 |
| $\alpha_{200/300}-\alpha_{50/100}$ | (0.60) | (0.60) | (0.58) | (0.63) | (0.62) | 0.64 | 0.56 | (0.63) | (0.45) | (0.44) | 0.78 | 0.70 |
| Density (g/cm³) | (2.45) | (2.56) | (2.47) | (2.47) | (2.50) | 2.51 | 2.41 | (2.47) | (2.34) | (2.43) | (2.49) | (2.49) |
| Young's modulus (GPa) | (75.9) | (73.7) | (71.0) | (70.2) | (67.1) | 76.0 | (77.2) | (79.5) | (67.5) | (63.2) | (85.5) | (82.2) |
| Vickers hardness | (569) | | | (538) | (517) | 585 | (575) | (582) | (533) | (528) | (614) | (597) |
| Glass transition temperature Tg (° C.) | (718) | | | (675) | (664) | 710 | (723) | (748) | (648) | (620) | 768 | 746 |
| $T_2$ (° C.) | (1692) | | | (1621) | (1628) | 1645 | (1700) | (1713) | (1659) | (1643) | 1704 | (1643) |
| $T_4$ (° C.) | (1300) | | | (1250) | (1249) | 1275 | (1302) | (1323) | (1246) | (1232) | 1334 | (1295) |
| Devitrification temperature (° C.) | | | | | | 1270 | | | | | 1310 | 1295 |
| Devitrification viscosity $\log_{10}\eta_{TL}$ (d·Pa·s) | | | | | | | | | | | 4.1 | 3.9 |
| HF Weight loss value ((mg/cm²)/min) | (0.11) | | | (0.19) | (0.21) | (0.16) | (0.11) | (0.11) | (0.14) | (0.17) | (0.10) | (0.15) |
| Photoelastic constant (nm/(MPa·cm)) | (32.4) | | | (33.8) | (33.9) | 30.6 | 33.8 | (30.8) | (36.6) | (36.2) | (28.9) | (30.1) |

TABLE 4

| mol % | Ex. 37 | Ex. 38 | Ex. 39 | Ex. 40 | Ex. 41 | Ex. 42 | Ex. 43 | Ex. 44 | Ex. 45 | Ex. 46 | Ex. 47 | Ex. 48 |
|---|---|---|---|---|---|---|---|---|---|---|---|---|
| $SiO_2$ | 68.0 | 68.0 | 68.0 | 66.8 | 66.7 | 64.4 | 66.6 | 70.0 | 70.0 | 65.9 | 65.9 | 68.0 |
| $Al_2O_3$ | 13.0 | 13.0 | 13.0 | 13.0 | 12.9 | 13.0 | 12.9 | 12.0 | 12.0 | 12.9 | 12.9 | 13.0 |
| $B_2O_3$ | 4.7 | 5.8 | 6.4 | 4.6 | 4.4 | 8.5 | 5.6 | 2.4 | 2.4 | 6.2 | 6.2 | 4.7 |
| MgO | 6.0 | 4.2 | 3.6 | 8.0 | 9.0 | 7.1 | 7.7 | 8.0 | 8.0 | 8.0 | 8.0 | 6.0 |
| CaO | 5.3 | 5.0 | 5.0 | 6.6 | 6.0 | 4.0 | 6.2 | 5.6 | 5.6 | 4.0 | 4.0 | 5.3 |
| SrO | 3.0 | 4.0 | 4.0 | 1.0 | 1.0 | 3.0 | 1.0 | 2.0 | 2.0 | 3.0 | 3.0 | 3.0 |
| BaO | 0 | 0 | 0 | 0 | 0 | 0 | 0 | 0 | 0 | 0 | 0 | 0 |
| ZnO | 0 | 0 | 0 | 0 | 0 | 0 | 0 | 0 | 0 | 0 | 0 | 0 |
| MgO + CaO | 11.3 | 9.2 | 8.6 | 14.6 | 15.0 | 11.1 | 13.9 | 13.6 | 13.6 | 12.0 | 12.0 | 11.3 |
| MgO + CaO + SrO + BaO + ZnO | 14.3 | 13.2 | 12.6 | 15.6 | 16.0 | 14.1 | 14.9 | 15.6 | 15.6 | 15.0 | 15.0 | 14.3 |
| Cooling rate R (° C./min) | 1 | 1 | 1 | 1 | 1 | 1 | 1 | 40 | 100 | 40 | 100 | 40 |
| Fictive viscosity $\log_{10}\eta$ (d·Pa·s) | 14.1 | 14.1 | 14.1 | 14.1 | 14.1 | 14.1 | 14.1 | 12.5 | 12.1 | 12.5 | 12.1 | 12.5 |
| (1) | 3.39 | 3.41 | 3.38 | 3.38 | 3.37 | 3.37 | 3.33 | 3.45 | 3.46 | 3.45 | 3.47 | 3.46 |
| (2) | 2.49 | 2.49 | 2.48 | 2.48 | 2.48 | 2.47 | 2.46 | 2.49 | 2.49 | 2.49 | 2.49 | 2.49 |
| (3) | 82.6 | 80.0 | 79.1 | 84.8 | 85.5 | 79.5 | 83.5 | 85.5 | 85.5 | 82.2 | 82.2 | 82.6 |
| (4) | 1.25 | 1.23 | 1.23 | 1.26 | 1.26 | 1.25 | 1.25 | 1.24 | 1.24 | 1.25 | 1.25 | 1.24 |
| (5) | 0.73 | 0.69 | 0.68 | 0.76 | 0.78 | 0.72 | 0.74 | 0.74 | 0.73 | 0.74 | 0.74 | 0.72 |
| $\alpha_{100/200}$ | 3.39 | 3.36 | 3.38 | 3.35 | 3.37 | 3.35 | 3.32 | 3.46 | 3.42 | 3.45 | 3.46 | 3.46 |
| $\alpha_{200/300}/\alpha_{50/100}$ | 1.25 | 1.26 | 1.22 | 1.26 | 1.25 | 1.25 | 1.26 | 1.25 | 1.25 | 1.26 | 1.22 | 1.24 |
| $\alpha_{200/300}-\alpha_{50/100}$ | 0.73 | 0.77 | 0.67 | 0.77 | 0.72 | 0.74 | 0.76 | 0.76 | 0.76 | 0.77 | 0.69 | 0.71 |
| Density (g/cm³) | (2.49) | (2.49) | (2.48) | 2.47 | (2.48) | (2.47) | (2.47) | (2.49) | (2.49) | (2.49) | (2.49) | (2.49) |
| Young's modulus (GPa) | (82.6) | (80.0) | (79.1) | 84.6 | (85.5) | 80.6 | 84.1 | (85.5) | (85.5) | (82.2) | (82.2) | (82.6) |
| Vickers hardness | (598) | (586) | (581) | 645 | (611) | (584) | (601) | (614) | (614) | (597) | (597) | (598) |
| Glass transition temperature Tg (° C.) | 754 | 747 | 746 | 754 | 753 | 737 | 760 | 768 | 768 | 746 | 746 | 754 |
| $T_2$ (° C.) | (1680) | (1689) | (1691) | 1647 | (1647) | (1628) | (1653) | 1704 | 1704 | (1643) | (1643) | (1680) |
| $T_4$ (° C.) | (1308) | (1312) | (1312) | 1295 | (1284) | (1262) | (1284) | 1334 | 1334 | (1279) | (1279) | (1308) |
| Devitrification temperature (° C.) | 1285 | 1295 | 1295 | 1305 | 1285 | | | 1310 | 1310 | 1295 | 1295 | 1285 |
| Devitrification viscosity $\log_{10}\eta_{TL}$ (d·Pa·s) | 4.2 | 4.1 | 4.1 | 3.9 | 4.0 | | | 4.1 | 4.1 | 3.9 | 3.9 | 4.2 |
| HF Weight loss value ((mg/cm²)/min) | (0.12) | (0.13) | (0.12) | 0.13 | 0.14 | 0.13 | 0.11 | (0.10) | (0.10) | (0.15) | (0.15) | (0.12) |
| Photoelastic constant (nm/(MPa·cm)) | (29.8) | (30.6) | (30.9) | 28.9 | (29.3) | (31.2) | (30.1) | (28.9) | (28.9) | (30.1) | (30.1) | (29.8) |

TABLE 5

| mol % | Ex. 49 | Ex. 50 | Ex. 51 | Ex. 52 | Ex. 53 | Ex. 54 | Ex. 55 | Ex. 56 | Ex. 57 | Ex. 58 | Ex. 59 | Ex. 60 |
|---|---|---|---|---|---|---|---|---|---|---|---|---|
| $SiO_2$ | 68.0 | 68.0 | 68.0 | 68.0 | 68.0 | 64.3 | 63.6 | 65.9 | 65.9 | 65.9 | 64.8 | 64.0 |
| $Al_2O_3$ | 13.0 | 13.0 | 13.0 | 13.0 | 13.0 | 13.0 | 13.3 | 14.0 | 14.0 | 14.0 | 15.5 | 16.0 |
| $B_2O_3$ | 4.7 | 5.8 | 5.8 | 6.4 | 6.4 | 7.0 | 10.9 | 7.3 | 6.8 | 6.6 | 7.8 | 8.6 |
| MgO | 6.0 | 4.2 | 4.2 | 3.6 | 3.6 | 9.0 | 5.5 | 4.0 | 5.0 | 5.6 | 4.3 | 4.2 |
| CaO | 5.3 | 5.0 | 5.0 | 5.0 | 5.0 | 5.7 | 1.0 | 7.0 | 6.0 | 5.0 | 1.6 | 1.0 |
| SrO | 3.0 | 4.0 | 4.0 | 4.0 | 4.0 | 1.0 | 5.8 | 1.8 | 2.3 | 2.9 | 4.0 | 2.3 |
| BaO | 0 | 0 | 0 | 0 | 0 | 0 | 0 | 0 | 0 | 0 | 2.0 | 3.9 |
| ZnO | 0 | 0 | 0 | 0 | 0 | 0 | 0 | 0 | 0 | 0 | 0 | 0 |
| MgO + CaO | 11.3 | 9.2 | 9.2 | 8.6 | 8.6 | 14.7 | 6.5 | 11.0 | 11.0 | 10.6 | 5.9 | 5.2 |
| MgO + CaO + SrO + BaO + ZnO | 14.3 | 13.2 | 13.2 | 12.6 | 12.6 | 15.7 | 12.3 | 12.8 | 13.3 | 13.5 | 11.9 | 11.4 |
| Cooling rate R (° C./min) | 100 | 40 | 100 | 40 | 100 | 40 | 40 | 1 | 1 | 1 | 40 | 40 |
| Fictive viscosity $\log_{10}\eta$ (d · Pa · s) | 12.1 | 12.5 | 12.1 | 12.5 | 12.1 | 12.5 | 12.5 | 14.1 | 14.1 | 14.1 | 12.5 | 12.5 |
| (1) | 3.47 | 3.47 | 3.49 | 3.45 | 3.46 | 3.43 | 3.40 | 3.32 | 3.33 | 3.33 | 3.39 | 3.40 |
| (2) | 2.49 | 2.49 | 2.49 | 2.48 | 2.48 | 2.47 | 2.48 | 2.46 | 2.47 | 2.48 | 2.54 | 2.57 |
| (3) | 82.6 | 80.0 | 80.0 | 79.1 | 79.1 | 83.1 | 74.9 | 80.4 | 81.2 | 81.4 | 78.3 | 77.0 |
| (4) | 1.24 | 1.23 | 1.22 | 1.22 | 1.22 | 1.25 | 1.23 | 1.24 | 1.25 | 1.26 | 1.25 | 1.25 |
| (5) | 0.72 | 0.69 | 0.69 | 0.67 | 0.67 | 0.75 | 0.68 | 0.71 | 0.73 | 0.74 | 0.74 | 0.73 |
| $\alpha_{100/200}$ | 3.44 | 3.45 | 3.50 | 3.49 | 3.47 | 3.39 | 3.35 | 3.31 | 3.32 | 3.31 | 3.31 | 3.32 |
| $\alpha_{200/300}/\alpha_{50/100}$ | 1.24 | 1.22 | 1.22 | 1.24 | 1.22 | 1.26 | 1.21 | 1.25 | 1.25 | 1.23 | 1.23 | 1.23 |
| $\alpha_{200/300}-\alpha_{50/100}$ | 0.73 | 0.66 | 0.67 | 0.74 | 0.68 | 0.76 | 0.63 | 0.72 | 0.73 | 0.68 | 0.67 | 0.68 |
| Density (g/cm³) | (2.49) | (2.49) | (2.49) | (2.48) | (2.48) | (2.47) | 2.48 | (2.46) | 2.47 | (2.48) | (2.54) | (2.57) |
| Young's modulus (GPa) | (82.6) | (80.0) | (80.0) | (79.1) | (79.1) | 83.4 | 76.4 | (80.4) | (81.2) | (81.4) | 79.3 | 78.2 |
| Vickers hardness | (598) | (586) | (586) | (581) | (581) | (600) | (562) | (583) | (587) | (589) | (567) | (556) |
| Glass transition temperature Tg (° C.) | 754 | 747 | 747 | 746 | 746 | (730) | (698) | 750 | 755 | 754 | (741) | (738) |
| $T_2$ (° C.) | (1680) | (1689) | (1689) | (1691) | (1691) | (1616) | (1629) | (1660) | (1657) | (1655) | (1664) | (1665) |
| $T_4$ (° C.) | (1308) | (1312) | (1312) | (1312) | (1312) | (1256) | (1260) | (1290) | (1290) | (1290) | (1300) | (1300) |
| Devitrification temperature (° C.) | 1285 | 1295 | 1295 | 1295 | 1295 | >1340 | 1315 | 1350 | 1350 | 1340 | 1380 | 1380 |
| Devitrification viscosity $\log_{10}\eta_{TL}$ (d · Pa · s) | 4.2 | 4.1 | 4.1 | 4.1 | 4.1 | 3.4 | 3.6 | 3.6 | 3.6 | 3.6 | 3.3 | 3.3 |
| HF Weight loss value ((mg/cm²)/min) | (0.12) | (0.13) | (0.13) | (0.12) | (0.12) | 0.14 | 0.16 | (0.14) | (0.15) | (0.14) | 0.16 | 0.17 |
| Photoelastic constant (nm/(MPa · cm)) | (29.8) | (30.6) | (30.6) | (30.9) | (30.9) | (30.3) | (32.3) | (31.1) | (30.6) | (30.4) | (30.1) | (29.7) |

TABLE 6

| mol % | Ex. 61 | Ex. 62 | Ex. 63 | Ex. 64 | Ex. 65 | Ex. 66 | Ex. 67 | Ex. 68 | Ex. 69 | Ex. 70 | Ex. 71 |
|---|---|---|---|---|---|---|---|---|---|---|---|
| $SiO_2$ | 66.2 | 66.5 | 66.0 | 66.4 | 66.3 | 66.4 | 66.3 | 66.5 | 66.0 | 66.4 | 66.7 |
| $Al_2O_3$ | 16.0 | 13.5 | 13.0 | 12.8 | 12.5 | 12.7 | 12.5 | 12.1 | 13.0 | 12.5 | 12.5 |
| $B_2O_3$ | 6.4 | 6.6 | 7.4 | 5.5 | 5.8 | 5.3 | 5.6 | 5.7 | 5.0 | 5.2 | 4.6 |
| MgO | 4.0 | 6.8 | 7.1 | 8.0 | 8.0 | 8.0 | 7.6 | 8.2 | 6.3 | 7.3 | 8.0 |
| CaO | 1.0 | 1.0 | 1.0 | 4.0 | 3.0 | 4.0 | 4.0 | 3.3 | 8.7 | 5.4 | 7.2 |
| SrO | 1.4 | 5.7 | 5.5 | 3.3 | 4.4 | 3.6 | 4.0 | 4.3 | 1.0 | 3.3 | 1.0 |
| BaO | 5.0 | 0 | 0 | 0 | 0 | 0 | 0 | 0 | 0 | 0 | 0 |
| ZnO | 0 | 0 | 0 | 0 | 0 | 0 | 0 | 0 | 0 | 0 | 0 |
| MgO + CaO | 5.0 | 7.8 | 8.1 | 12.0 | 11.0 | 12.0 | 11.6 | 11.5 | 15.0 | 12.7 | 15.2 |
| MgO + CaO + SrO + BaO + ZnO | 11.4 | 13.5 | 13.6 | 15.3 | 15.3 | 15.6 | 15.6 | 15.8 | 16.0 | 16.0 | 16.2 |
| Cooling rate R (° C./min) | 40 | 40 | 40 | 1 | 1 | 1 | 1 | 1 | 1 | 1 | 1 |
| Fictive viscosity $\log_{10}\eta$ (d · Pa · s) | 12.5 | 12.5 | 12.5 | 14.1 | 14.1 | 14.1 | 14.1 | 14.1 | 14.1 | 14.1 | 14.1 |
| (1) | 3.40 | 3.39 | 3.40 | 3.42 | 3.47 | 3.47 | 3.52 | 3.52 | 3.57 | 3.57 | 3.47 |
| (2) | 2.60 | 2.51 | 2.50 | 2.50 | 2.51 | 2.51 | 2.51 | 2.51 | 2.48 | 2.51 | 2.48 |
| (3) | 78.4 | 80.0 | 79.1 | 82.7 | 81.6 | 82.8 | 82.0 | 81.6 | 84.1 | 82.8 | 84.7 |
| (4) | 1.25 | 1.25 | 1.25 | 1.25 | 1.25 | 1.25 | 1.24 | 1.24 | 1.24 | 1.24 | 1.25 |
| (5) | 0.74 | 0.74 | 0.72 | 0.75 | 0.75 | 0.76 | 0.74 | 0.74 | 0.75 | 0.75 | 0.75 |
| $\alpha_{100/200}$ | 3.27 | 3.39 | 3.34 | 3.40 | 3.47 | 3.49 | 3.53 | 3.53 | 3.56 | 3.57 | 3.42 |
| $\alpha_{200/300}/\alpha_{50/100}$ | 1.22 | 1.24 | 1.24 | 1.25 | 1.25 | 1.25 | 1.25 | 1.24 | 1.25 | 1.25 | 1.27 |
| $\alpha_{200/300}-\alpha_{50/100}$ | 0.65 | 0.70 | 0.71 | 0.75 | 0.76 | 0.75 | 0.76 | 0.74 | 0.78 | 0.78 | 0.80 |
| Density (g/cm³) | (2.60) | (2.51) | (2.50) | (2.50) | (2.51) | (2.51) | (2.51) | (2.51) | 2.48 | (2.51) | 2.47 |
| Young's modulus (GPa) | 77.5 | 78.4 | 79.3 | (82.7) | (81.7) | (82.8) | (82.0) | (81.6) | 84.0 | (82.8) | 84.4 |
| Vickers hardness | (560) | (585) | (583) | (600) | (597) | (601) | (599) | (599) | (606) | (602) | (609) |
| Glass transition temperature Tg (° C.) | (761) | (739) | (728) | 749 | 744 | 747 | 745 | 745 | 761 | 750 | 750 |
| $T_2$ (° C.) | (1702) | (1661) | (1653) | (1650) | (1650) | (1650) | (1650) | (1650) | (1646) | (1650) | (1650) |
| $T_4$ (° C.) | (1330) | (1295) | (1285) | (1285) | (1284) | (1286) | (1285) | (1283) | (1283) | (1286) | (1284) |
| Devitrification temperature (° C.) | 1380 | 1320 | 1310 | 1290 | 1270 | 1310 | 1290 | 1290 | 1270 | 1270 | 1295 |
| Devitrification viscosity $\log_{10}\eta_{TL}$ (d · Pa · s) | 3.5 | 3.8 | 3.8 | 4.0 | 4.1 | 3.8 | 4.0 | 3.9 | 4.1 | 4.1 | 3.9 |
| HF Weight loss value ((mg/cm²)/min) | 0.16 | 0.13 | 0.13 | (0.14) | (0.15) | (0.15) | (0.15) | (0.15) | (0.16) | (0.15) | (0.14) |
| Photoelastic constant (nm/(MPa · cm)) | (28.6) | (30.3) | (30.7) | (29.7) | (29.8) | (29.6) | (29.8) | (29.8) | (29.6) | (29.6) | (29.5) |

TABLE 7

| | Silicon Substrate |
|---|---|
| $\alpha_{Si50/100}$ | 2.94 ppm/° C. |
| $\alpha_{Si100/200}$ | 3.37 ppm/° C. |
| $\alpha_{Si200/300}$ | 3.69 ppm/° C. |
| $\alpha_{Si200/300}/\alpha_{Si50/100}$ | 1.25 |
| $\alpha_{Si200/300} - \alpha_{Si50/100}$ | 0.75 ppm/° C. |

TABLE 8

| | Ex. 9 | Ex. 10 | Ex. 40 |
|---|---|---|---|
| Degree of wear | 60 | 57 | 51 |

TABLE 9

| | Ex. 1 | Ex. 14 | Ex. 18 | Ex. 26 | Ex. 29 |
|---|---|---|---|---|---|
| Degree of wear | 60 | 57 | 59 | 58 | 62 |

Examples 1 to 19 and 22 to 29 are present examples, Examples 20 and 21 are reference examples, and Examples 30 to 71 are comparative examples. In the alkali-free glass substrates of Examples 1 to 29, the average coefficient of thermal expansion $\alpha_{100/200}$ at 100° C. to 200° C. is from 3.10 ppm/° C. to 3.70 ppm/° C. and therefore, in the heat treatment step of laminating together a silicon substrate and a glass substrate, the residual stain generated in the silicon substrate is likely to be small. In addition, since the Young's modulus is 76 GPa or less and the density is 2.42 g/cm³ or more, the rate at the time of grinding the glass readily rises.

In the glass substrates of Examples 30 to 71, any one or more of $\alpha_{100/200}$, Young's modulus and density deviates from the range regarding the glass substrate in one embodiment of the present invention. In the glass substrate of Example 34, the range of $\alpha_{200/300}/\alpha_{50/100}$ deviates from the preferable range regarding the glass substrate in one embodiment of the present invention. In the glass substrates of Examples 30 to 54 and 56 to 71, the range of any one or more of (1) to (4) deviates from the preferable range regarding the glass substrate in one embodiment of the present invention. Consequently, in the heat treatment step of laminating together a silicon substrate and a glass substrate, the residual stain generated in the silicon substrate is likely to be large. In addition, in the step of grinding the glass substrate, the grinding rate tends to decrease.

In Table 8, the values of degree of wear of Examples 9, 10 and 40 are shown. In Table 9, the values of degree of wear of Examples 1, 14, 18, 26 and 29 are shown. As seen from Tables 8 and 9, in the glass substrates of Examples 1, 9, 10, 14, 18, 26 and 29 which are Examples, the degree of wear is high, and in the glass substrate of Example 40 which is Comparative Example, the degree of wear is low. It was found from these results that the alkali-free glass substrate in one embodiment of the present invention enables a high grinding rate.

Figure 2:
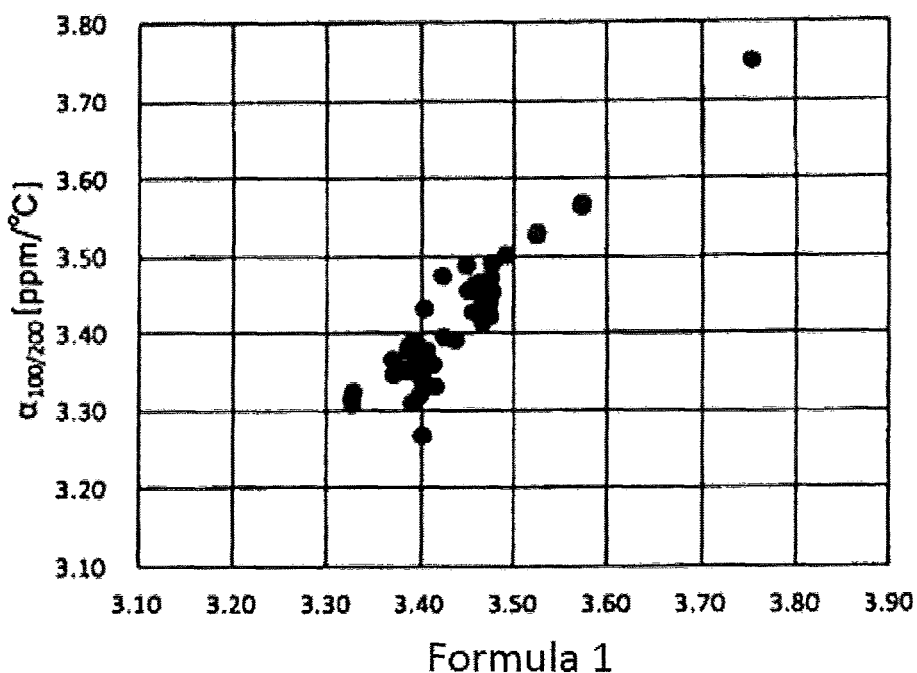
FIG. 2 is a diagram graphically illustrating the error between the value determined according to formula (1) and the value of $\alpha_{100/200}$.
Figure 3:
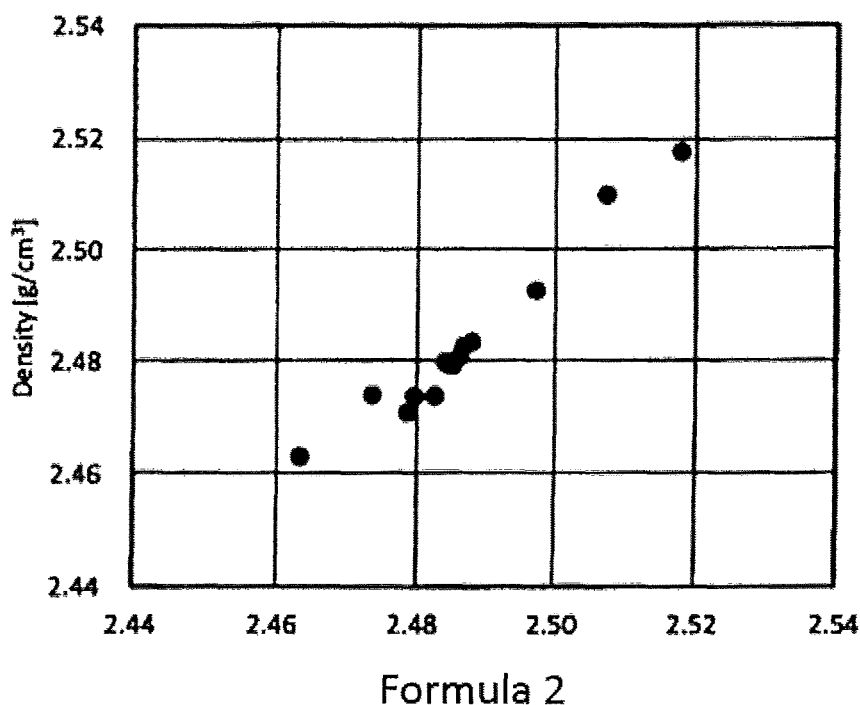
FIG. 3 is a diagram graphically illustrating the error between the value determined according to formula (2) and the density.
Figure 4:
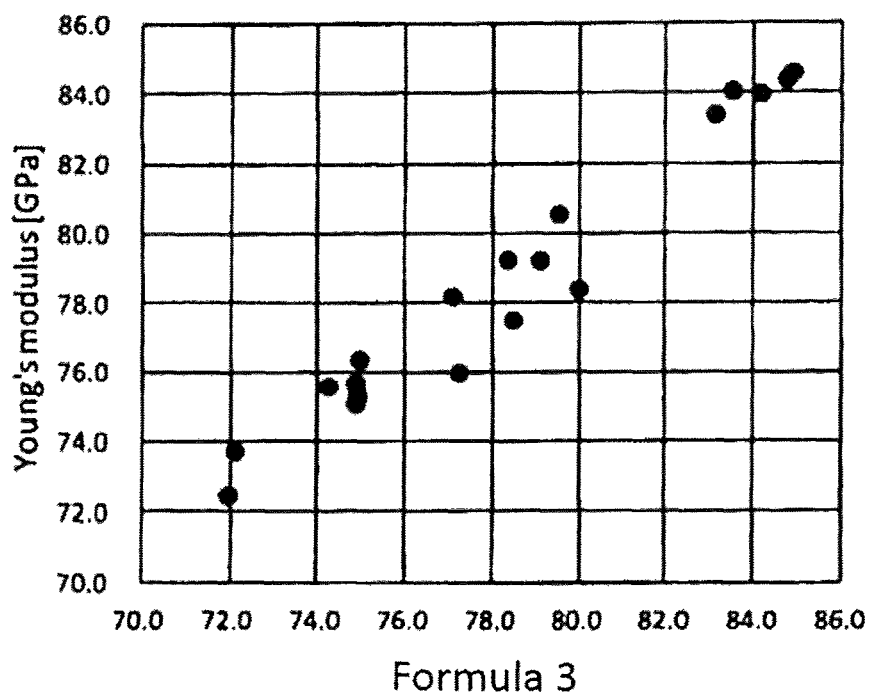
FIG. 4 is a diagram graphically illustrating the error between the value determined according to formula (3) and the Young's modulus.
Figure 5:
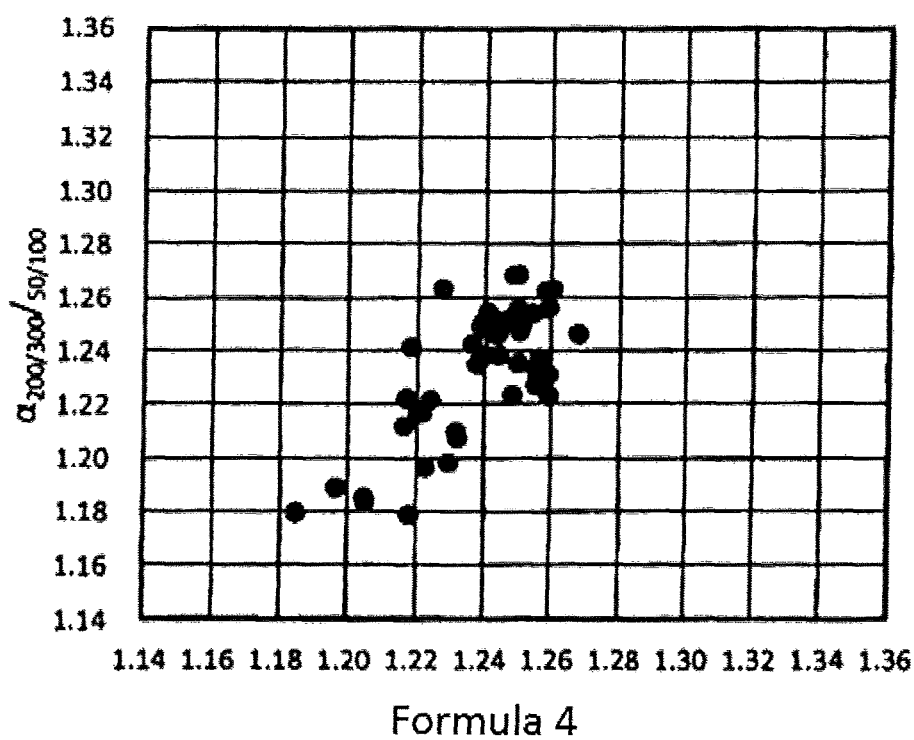
FIG. 5 is a diagram graphically illustrating the error between the value determined according to formula (4) and the value of $\alpha_{200/300}/\alpha_{50/100}$.

FIG. 2 shows a diagram graphically illustrating the error between the value determined according to formula (1) and the value of $\alpha_{100/200}$. FIG. 3 shows a diagram graphically illustrating the error between the value determined according to formula (2) and the density. FIG. 4 shows a diagram graphically illustrating the error between the value determined according to formula (3) and the Young's modulus. FIG. 5 shows a diagram graphically illustrating the error between the value determined according to formula (4) and the value of $\alpha_{200/300}/\alpha_{50/100}$. FIG. 6 shows a diagram graphically illustrating the error between the value determined according to formula (5) and the value of $\alpha_{200/300}-\alpha_{50/100}$. As seen from FIG. 2 to FIG. 6, there is a correlation between the value determined according to formula (1) to (5) and the measured value.

While the invention has been described in detail and with reference to specific embodiments thereof, it will be apparent to one skilled in the art that various changes and modifications can be made therein without departing from the spirit and scope of the invention. This application is based on Japanese Patent Application (Patent Application No. 2016-104652) filed on May 25, 2016 and Japanese Patent Application (Patent Application No. 2016-154685) filed on Aug. 5, 2016, the entirety of which is incorporated herein by way of reference. In addition, all references cited herein are incorporated in their entirety herein.

INDUSTRIAL APPLICABILITY

In the glass substrate according to the present invention, the difference in the coefficient of thermal expansion from the silicon substrate is small, so that in the heat treatment step of laminating together the glass substrate with the silicon substrate and in the subsequent heat treatment step, generation of residual strain attributable to the difference in the coefficient of thermal expansion can be suppressed. Accordingly, the glass substrate is suitable as a glass substrate for an image sensor such as MEMS, CMOS or CIS, for which miniaturization of a device by wafer-level packaging is effective.

In addition, the glass substrate is suitable as a cover glass for a projection-use display device, for example, as a cover glass of LCOS. For example, in LCOS or an image sensor, after forming an electronic circuit on a silicon substrate, the cover glass is adhered to the silicon substrate by using a resin or glass frit as an adhesive material. The glass substrate according to the present invention produces a small difference in the coefficient of thermal expansion from the silicon substrate and therefore, the stress generated on the adhesive interface when the temperature is changed at the time of device manufacture or use is reduced. This promises to reduce color unevenness attributable to photoelastic deformation or enhance the long-term reliability.

Furthermore, the glass substrate according to the present invention is suitable as a hole-punched substrate of a glass interposer (GIP) or as a support glass for semiconductor background. Moreover, the glass substrate of the present invention can be suitably used for any application as long as the glass substrate is laminated together with a silicon substrate.

DESCRIPTION OF REFERENCE NUMERALS AND SIGNS

10 Silicon substrate
20 Resin
30 Laminated substrate
G1 Glass substrate

The invention claimed is:

1. An alkali-free glass substrate comprising, as represented by molar percentage based on oxides, 12.1% or more of $Al_2O_3$, 9.2% or more of $B_2O_3$, and 1% or more of SrO, and having an average coefficient of thermal expansion $\alpha_{100/200}$ at 100 to 200° C. of from 3.10 ppm/° C. to 3.70 ppm/° C., a Young's modulus of 76.0 GPa or less, and a density of 2.42 g/cm³ or more,
  wherein the alkali-free glass substrate does not contain $SnO_2$,
  wherein a combined amount of $ZrO_2$, $Y_2O_3$, $La_2O_3$, $TiO_2$, and $SnO_2$ in the alkali-free glass substrate is 0.5% or less by molar percentage based on oxides, and
  wherein a devitrification temperature of the alkali-free glass substrate is higher than a temperature $T_4$ at which a viscosity of the glass substrate becomes $10^4$ d·Pa·s.

2. The alkali-free glass substrate according to claim 1, having the following composition, as represented by molar percentage based on oxides:
  $SiO_2$: from 50% to 75%,
  $Al_2O_3$: from 12.1% to 16%,
  $B_2O_3$: from 9.2% to 16%,
  MgO: from 0% to 10%,
  CaO: from 0% to 10%,
  SrO: from 1% to 10%,
  BaO: from 0% to 10%, and
  ZnO: from 0% to 10%.

3. The alkali-free glass substrate according to claim 1, having a total content of MgO and CaO of 1.0% or more as represented by molar percentage based on oxides.

4. The alkali-free glass substrate according to claim 1, having a value $\alpha_{200/300}/\alpha_{50/100}$ obtained by dividing an average coefficient of thermal expansion $\alpha_{200/300}$ at 200 to 300° C. by an average coefficient of thermal expansion $\alpha_{50/100}$ at 50 to 100° C. of from 1.15 to 1.35.

5. The alkali-free glass substrate according to claim 1, having a value $\alpha_{200/300}/\alpha_{50/100}$ obtained by dividing an average coefficient of thermal expansion $\alpha_{200/300}$ at 200 to 300° C. by an average coefficient of thermal expansion $\alpha_{50/100}$ at 50 to 100° C. of 1.15 or more and less than 1.20.

6. The alkali-free glass substrate according to claim 1, having a value $\alpha_{200/300}-\alpha_{50/100}$ obtained by subtracting an average coefficient of thermal expansion $\alpha_{50/100}$ at 50 to 100° C. from an average coefficient of thermal expansion $\alpha_{200/300}$ at 200 to 300° C. of from 0.30 to 1.20.

7. The alkali-free glass substrate according to claim 1, having a glass transition temperature of 680° C. or more.

8. The alkali-free glass substrate according to claim 1, having a degree of wear of 55 or more.

9. The alkali-free glass substrate according to claim 1, having a Vickers hardness of 600 or less.

10. The alkali-free glass substrate according to claim 1, which is used for at least either one of a support substrate for semiconductor production process and a cover glass.

11. The alkali-free glass substrate according to claim 1, having an area of at least one main surface of 0.03 m² or more.

12. The alkali-free glass substrate according to claim 1, having a thickness of 1.0 mm or less.

13. The alkali-free glass substrate according to claim 1, having a density of defects with a size of from 0.5 μm to 1 mm contained in the glass substrate of 1 defect/cm² or less.

14. The alkali-free glass substrate according to claim 1, having a value represented by the following formula (1) of from 3.10 to 3.70:

$$0.0181\times(\text{content of } SiO_2)+0.0004\times(\text{content of } Al_2O_3)+0.0387\times(\text{content of } B_2O_3)+0.0913\times(\text{content of MgO})+0.1621\times(\text{content of CaO})+0.1900\times(\text{content of SrO})+0.2180\times(\text{content of BaO})+0.0424\times(\text{content of ZnO})+0.0391\times(12.3+\log_{10}60-\log_{10}\eta), \quad \text{formula (1)}:$$

wherein the contents of $SiO_2$, $Al_2O_3$, $B_2O_3$, MgO, CaO, SrO BaO and ZnO are contents as represented by molar percentage based on oxides contained in an obtained glass, and η is a fictive viscosity (unit: d·Pa·s).

15. The alkali-free glass substrate according to claim 1, having a value represented by the following formula (2) of 2.42 or more:

$$0.0218\times(\text{content of } SiO_2)+0.0302\times(\text{content of } Al_2O_3)+0.0181\times(\text{content of } B_2O_3)+0.0330\times(\text{content of MgO})+0.0351\times(\text{content of CaO})+0.0488\times(\text{content of SrO})+0.0634\times(\text{content of BaO})+0.0419\times(\text{content of ZnO}), \quad \text{formula (2)}:$$

wherein the contents of $SiO_2$, $Al_2O_3$, $B_2O_3$, MgO, CaO, SrO, BaO and ZnO are contents as represented by molar percentage based on oxides contained in an obtained glass.

16. The alkali-free glass substrate according to claim 1, having a value represented by the following formula (3) of 76.0 or less:

$$0.677\times(\text{content of } SiO_2)+1.598\times(\text{content of } Al_2O_3)-0.220\times(\text{content of } B_2O_3)+1.466\times(\text{content of MgO})+1.135\times(\text{content of CaO})+0.667\times(\text{content of SrO})+0.298\times(\text{content of BaO})+1.027\times(\text{content of ZnO}), \quad \text{formula (3)}:$$

wherein the contents of $SiO_2$, $Al_2O_3$, $B_2O_3$, MgO, CaO, SrO, BaO and ZnO are contents as represented by molar percentage based on oxides contained in an obtained glass.

17. The alkali-free glass substrate according to claim 1, having a value represented by the following formula (4) of from 1.15 to 1.35:

$$0.0111\times(\text{content of } SiO_2)+0.0250\times(\text{content of } Al_2O_3)+0.0078\times(\text{content of } B_2O_3)+0.0144\times(\text{content of MgO})+0.0053\times(\text{content of CaO})+0.0052\times(\text{content of SrO})+0.0013\times(\text{content of BaO})+0.0121\times(\text{content of ZnO})-0.0041\times(12.3+\log_{10}60-\log_{10}\eta) \quad \text{formula (4)}.$$

18. The alkali-free glass substrate according to claim 1, having a value represented by the following formula (5) of from 0.30 to 1.20:

$$0.0368\times(\text{content of } Al_2O_3)-0.0054\times(\text{content of } B_2O_3)+0.0244\times(\text{content of MgO})+0.0143\times(\text{content of CaO})+0.0182\times(\text{content of SrO})+0.0097\times(\text{content of BaO})+0.097\times(\text{content of ZnO})-0.0032\times(12.3+\log_{10}60-\log_{10}\eta) \quad \text{formula (5)}:$$

wherein, the contents of $Al_2O_3$, wherein $B_2O_3$, MgO, CaO, SrO, BaO and ZnO are contents as represented by molar percentage based on oxides contained in an obtained glass.

19. The alkali-free glass substrate according to claim 1, comprising, as represented by molar percentage based on oxides:
  0% or more and 5.1% or less of CaO, and 1% or more and 4.3% or less of SrO.

20. A laminated substrate comprising the alkali-free glass substrate according to claim 1 and a silicon substrate stacked thereon.

21. A method for manufacturing an alkali-free glass substrate according to claim 1, comprising:
  a melting step of heating a glass raw material to obtain a molten glass,
  a refining step of removing bubbles from the molten glass,
  a forming step of forming the molten glass into a sheet-like shape to obtain a glass ribbon, and
  a slow cooling step of gradually cooling the glass ribbon to a room temperature state, wherein
  the composition of the obtained glass substrate and an average cooling rate R (unit: ° C./min) from a temperature at which a viscosity of the glass ribbon in the slow cooling step becomes $10^{11}$ d·Pa·s to a temperature at which a viscosity becomes $10^{14.5}$ d·Pa·s satisfy the following conditions (1) to (3):

$0.0181\times$(content of $SiO_7$)+$0.0004\times$(content of $Al_2O_3$)+$0.0387\times$(content of $B_2O_3$)+$0.0913\times$(content of MgO)+$0.1621\times$(content of CaO)+$0.1900\times$(content of SrO)+$0.2180\times$(content of BaO)+$0.0424\times$(content of ZnO)+$0.0391\times\log_{10}R$ is from 3.10 to 3.70,  condition (1):

$0.0218\times$(content of $SiO_7$)+$0.0302\times$(content of $Al_2O_3$)+$0.0181\times$(content of $B_2O_3$)+$0.0330\times$(content of MgO)+$0.0351\times$(content of CaO)+$0.0488\times$(content of SrO)+$0.0634\times$(content of BaO)+$0.0419\times$(content of ZnO) is 2.42 or more, and  condition (2):

$0.677\times$(content of $SiO_2$)+$1.598\times$(content of $Al_2O_3$)−$0.220\times$(content of $B_2O_3$)+$1.466\times$(content of MgO)+$1.135\times$(content of CaO)+$0.667\times$(content of SrO)+$0.298\times$(content of BaO)+$1.027\times$(content of ZnO) is 76.0 or less,  condition (3):

wherein the contents of $SiO_7$, $Al_2O_3$, $B_2O_3$, MgO, CaO, SrO, BaO and ZnO are contents as represented by molar percentage based on oxides contained in a obtained glass.

22. An alkali-free glass substrate having a degree of wear of 55 or more and being used for at least either one of a support substrate for semiconductor production process and a cover glass, wherein a combined amount of $ZrO_2$, $Y_2O_3$, $La_2O_3$, $TiO_2$, and $SnO_2$ in the alkali-free glass substrate is 0.5% or less by molar percentage based on oxides, wherein the alkali-free glass substrate comprises, as represented by molar percentage based on oxides, 12.1% or more of $Al_2O_3$ and 9.2% or more of $B_2O_3$, and wherein a devitrification temperature of the alkali-free glass substrate is higher than a temperature $T_4$ at which a viscosity of the glass substrate becomes $10^4$ d·Pa·s.

23. The alkali-free glass substrate according to claim 22, comprising, as represented by molar percentage based on oxides:

0% or more and 5.1% or less of CaO, and 1% or more and 4.3% or less of SrO.

24. A laminated substrate comprising the alkali-free glass substrate according to claim 22 and a silicon substrate stacked thereon.

25. The method for manufacturing an alkali-free glass substrate according to claim 24, wherein the composition of the obtained glass substrate satisfies the following conditions (4) and (5):

$0.0111\times$(content of $SiO_2$)+$0.0250\times$(content of $Al_2O_3$)+$0.0078\times$(content of $B_7O_3$)+$0.0144\times$(content of MgO)+$0.0053\times$(content of CaO)+$0.0052\times$(content of SrO)+$0.0013\times$(content of BaO)+$0.0121\times$(content of ZnO)−$0.0041\times\log_{10}R$ is from 1.15 to 1.35, and  condition (4):

$0.0368\times$(content of $Al_2O_3$)−$0.0054\times$(content of $B_2O_3$)+$0.0244\times$(content of MgO)+$0.0143\times$(content of CaO)+$0.0182\times$(content of SrO)+$0.0097\times$(content of BaO)+$0.097\times$(content of ZnO)−$0.0032\times\log_{10}R$ is from 0.30 to 1.20,  condition (5):

wherein the contents of $Al_7O_3$, $B_2O_3$, MgO, CaO, SrO, BaO and ZnO are contents as represented by molar percentage based on oxides contained in the obtained glass.

\* \* \* \* \*